(12) United States Patent
Shigenobu et al.

(10) Patent No.: US 8,228,214 B2
(45) Date of Patent: **\*Jul. 24, 2012**

(54) VARIABLE-LENGTH CODE DECODING APPARATUS AND METHOD

(75) Inventors: Yuya Shigenobu, Nara (JP); Motokazu Ozawa, Osaka (JP); Nobuo Higaki, Hyogo (JP); Takeshi Furuta, Kyoto (JP); Takahiro Kageyama, Osaka (JP); Masaki Minami, Osaka (JP)

(73) Assignee: Panasonic Corporation, Osaka (JP)

( * ) Notice: Subject to any disclaimer, the term of this patent is extended or adjusted under 35 U.S.C. 154(b) by 105 days.

This patent is subject to a terminal disclaimer.

(21) Appl. No.: 12/844,134

(22) Filed: Jul. 27, 2010

(65) Prior Publication Data

US 2010/0289674 A1 Nov. 18, 2010

Related U.S. Application Data

(63) Continuation of application No. PCT/JP2009/001298, filed on Mar. 24, 2009.

(30) Foreign Application Priority Data

Mar. 31, 2008 (JP) .................................. 2008-091012

(51) Int. Cl.
*H03M 7/40* (2006.01)
(52) U.S. Cl. .......................................... 341/67; 341/50
(58) Field of Classification Search .................... 341/67, 341/65, 87, 50, 51
See application file for complete search history.

(56) References Cited

U.S. PATENT DOCUMENTS

| 5,550,542 | A | * | 8/1996 | Inoue ............................. 341/67 |
| 5,561,690 | A | * | 10/1996 | Park ............................. 375/340 |
| 5,614,900 | A | * | 3/1997 | Watanabe ........................ 341/67 |
| 5,717,394 | A | * | 2/1998 | Schwartz et al. ............... 341/51 |
| 5,831,557 | A | * | 11/1998 | Handley ......................... 341/67 |
| 6,011,598 | A | | 1/2000 | Tsuji et al. |
| 6,437,712 | B1 | * | 8/2002 | Aoki ............................. 341/67 |

(Continued)

FOREIGN PATENT DOCUMENTS

JP 8-186822 7/1996

(Continued)

OTHER PUBLICATIONS

Japan Office action, mail date is May 31, 2011.

*Primary Examiner* — Jean B Jeanglaude
(74) *Attorney, Agent, or Firm* — Greenblum & Bernstein, P.L.C.

(57) ABSTRACT

A variable-length code decoding apparatus that decodes a bitstream includes: a storage unit that stores a variable-length code table; a bitstream cutout unit that outputs a bit string of a fixed length; a reference unit that outputs decoded data and a code length with reference to the storage unit; a determination unit that determines whether a bit string of the fixed length is accumulated; a determination unit that determines whether a bit string of a length that is shorter than the fixed length is accumulated; and a selection unit that selects one of the determination results from the determination units. The bitstream cutout unit sets a starting bit based on the selected determination result, and the selection unit switches the selection of the determination results from the determination units.

16 Claims, 16 Drawing Sheets

U.S. PATENT DOCUMENTS

| | | | |
|---|---|---|---|
| 6,738,525 B1 * | 5/2004 | Iwata | 382/246 |
| 6,980,138 B2 * | 12/2005 | Vassiliadis et al. | 341/67 |
| 2002/0114464 A1 * | 8/2002 | Wang | 380/216 |
| 2002/0114529 A1 * | 8/2002 | Horie | 382/247 |
| 2006/0119490 A1 * | 6/2006 | Lim et al. | 341/50 |
| 2007/0115156 A1 * | 5/2007 | Lim et al. | 341/67 |
| 2008/0266147 A1 | 10/2008 | Shigenobu et al. | |

FOREIGN PATENT DOCUMENTS

| | | |
|---|---|---|
| JP | 10-74140 | 3/1998 |
| JP | 11-122113 | 4/1999 |
| JP | 2000-138932 | 5/2000 |
| JP | 2002-43949 | 2/2002 |
| JP | 2008-278075 | 11/2008 |

* cited by examiner

| Codeword | Decoded Data | Code Length |
|---|---|---|
| 0 | a | 1 |
| 10 | b | 2 |
| 110 | c | 3 |
| 1110 | d | 4 |
| 11110 | e | 5 |
| 111110 | f | 6 |
| 1111110 | g | 7 |
| 11111110 | h | 8 |

FIG. 4

| Cycle | Inputted Bitstream | Bitstream Cutout Unit 100 | | | Table Reference Unit 101 | | Determination Unit 102 | Determination Unit 103 | Selection Signal 104 | Determination Method Control Unit 105 |
|---|---|---|---|---|---|---|---|---|---|---|
| | | Bit String | Buffer | Accumulation State | Decoded Data | Code Length | Determination Signal | Determination Signal | Determination Signal | Selection Signal |
| 1 | 1111 | 11110000 | 1111 | 4 | e | 5 | <u>0</u> | 0 | 0 | 0 |
| 2 | 1110 | 11111110 | 11111110 | 8 | h | 8 | 1 | <u>1</u> | 1 | 1 |
| 3 | 1110 | 11100000 | 1110 | 4 | d | 4 | 0 | <u>1</u> | 0 | 0 |
| 4 | 10 | 11101000 | 111010 | 6 | d | 4 | 0 | <u>1</u> | 1 | 1 |
| 5 | — | 10000000 | 10 | 2 | b | 2 | <u>0</u> | 1 | 0 | 0 |
| 6 | — | 10000000 | 10 | 2 | b | 2 | <u>0</u> | 1 | 1 | 1 |
| 7 | — | 00000000 | — | 0 | a | 1 | 0 | 0 | 0 | 0 |

※Underlined numbers are selected by Selection Unit 104

FIG. 5

| Cycle | Inputted Bitstream | Bitstream Cutout Unit 100 | | | Table Reference Unit 101 | | Determination Unit 102 | Determination Unit 103 | Selection Signal 104 | Determination Method Control Unit 105 |
|---|---|---|---|---|---|---|---|---|---|---|
| | | Bit String | Buffer | Accumulation State | Decoded Data | Code Length | Determination Signal | Determination Signal | Determination Signal | Selection Signal |
| 1 | 11 | 11000000 | 11 | 2 | c | 3 | 0̲ | 0 | 0 | 0 |
| 2 | 10 | 11100000 | 1110 | 4 | d | 4 | 0 | 1̲ | 1 | 1 |
| 3 | 11 | 11000000 | 11 | 2 | c | 3 | 0̲ | 0 | 0 | 0 |
| ... | ... | ... | ... | ... | ... | ... | ... | ... | ... | ... |

※Underlined numbers are selected by Selection Unit 104

FIG. 6

| Accumulated Bit Length | Accumulation State | |
|---|---|---|
| | Output Format 1 | Output Format 2 |
| 0 | 0 | 00000000 |
| 1 | 1 | 10000000 |
| 2 | 2 | 11000000 |
| 3 | 3 | 11100000 |
| 4 | 4 | 11110000 |
| 5 | 5 | 11111000 |
| 6 | 6 | 11111100 |
| 7 | 7 | 11111110 |
| 8 | 8 | 11111111 |
| 9 | 8 | 11111111 |
| ⋮ | ⋮ | ⋮ |

FIG. 8

| Cycle | Inputted Bitstream | Bitstream End Detection Unit 206 | Bitstream Cutout Unit 100 | | | Table Reference Unit 101 | | Determination Unit 102 | Determination Unit 203 | Selection Signal 204 |
|---|---|---|---|---|---|---|---|---|---|---|
| | | End Detection Signal | Bit String | Buffer | Accumulation State | Decoded Data | Code Length | Determination Signal | Determination Signal | Determination Signal |
| 1 | 1111 | 0 | 11110000 | 1111 | 4 | e | 5 | 0 | 1 | 0 |
| 2 | 1110 | 0 | 11111110 | 11111110 | 8 | h | 8 | <u>1</u> | 1 | 1 |
| 3 | 1110 | 0 | 11100000 | 1110 | 4 | d | 4 | 0 | 1 | 0 |
| 4 | 10 | 1 | 11101000 | 111010 | 6 | d | 4 | 0 | <u>1</u> | 1 |
| 5 | — | 1 | 10000000 | 10 | 2 | b | 2 | 0 | <u>1</u> | 1 |
| 6 | — | 1 | 00000000 | — | 0 | a | 1 | 0 | <u>0</u> | 0 |

※Underlined numbers are selected by Selection Unit 204

FIG. 10

| Cycle | Inputted Bitstream | Bitstream Cutout Unit 100 | | | Table Reference Unit 101 | | Determination Unit 102 | Determination Unit 303 | Selection Unit 304 |
|---|---|---|---|---|---|---|---|---|---|
| | | Bit String | Buffer | Accumulation State | Decoded Data | Code Length | Determination Signal | Determination Signal | Determination Signal |
| 1 | 1111 | 11110000 | 1111 | 4 | e | 5 | 0 | 1 | 0 |
| 2 | 1110 | 11111110 | 1111110 | 8 | h | 8 | 1 | 1 | 1 |
| 3 | 1110 | 11100000 | 1110 | 4 | d | 4 | 0 | 1 | 0 |
| 4 | 10 | 11101000 | 111010 | 6 | d | 4 | 0 | 1 | 1 |
| 5 | — | 10000000 | 10 | 2 | b | 2 | 0 | 1 | 1 |
| 6 | — | 00000000 | — | 0 | a | 1 | 0 | 0 | 0 |

※Underlined numbers are selected by Selection Unit 304

FIG. 12

| Cycle | Inputted Bitstream | Bitstream End Detection Unit 206 | Data Adding Unit 407 | Bitstream Cutout Unit 100 | | | | Table Reference Unit 101 | | Determination Unit 102 |
|---|---|---|---|---|---|---|---|---|---|---|
| | | End Detection Signal | Bit String | Bit String | Buffer | Accumulation State | Decoded Data | Code Length | Determination Signal |
| 1 | 1111 | 0 | 1111 | 11110000 | 1111 | 4 | e | 5 | 0 |
| 2 | 1110 | 0 | 1110 | 11111110 | 11111110 | 8 | h | 8 | 1 |
| 3 | 1110 | 0 | 1110 | 11100000 | 1110 | 4 | d | 4 | 0 |
| 4 | 10 | 1 | 100000000 | 11101000 | 1110100000000 | 13 | d | 4 | 1 |
| 5 | — | 1 | — | 10000000 | 100000000 | 9 | b | 2 | 1 |
| 6 | — | 1 | — | 00000000 | 0000000 | 7 | a | 1 | 0 |

| Codeword | Decoded Data | Code Length |
|----------|--------------|-------------|
| 0        | i            | 1           |
| 01       | j            | 2           |
| 001      | k            | 3           |
| 0001     | l            | 4           |

FIG. 15

| Cycle | Bitstream End Detection Unit 206 | Data Adding Unit 407 | Bitstream Cutout Unit 100 | | | Determination Unit 502 |
|---|---|---|---|---|---|---|
| | Inputted Bitstream / End Detection Signal | Bit String | Bit String | Buffer | Accumulation State | Determination Signal |
| 1 | 1111 / 0 | 1111 | 11110000 | 1111 | 4 | 0 |
| 2 | 1110 / 0 | 1110 | 11111110 | 11111110 | 8 | 1 |
| 3 | 0001 / 0 | 0001 | 00010000 | 0001 | 4 | 1 |
| 4 | 1111 / 0 | 1111 | 11110000 | 1111 | 4 | 0 |
| ... | ... | ... | ... | ... | ... | ... |

| Cycle | Table Reference Unit 101 | | Table Reference Unit 501 | | Selection Unit 508 / Selection Unit 509 | | Table Control Unit 510 |
|---|---|---|---|---|---|---|---|
| | Decoded Data | Code Length | Decoded Data | Code Length | Decoded Data / Code Length | Selection Signal | Maximum Code Length |
| 1 | e | 5 | i | 1 | e / 5 | 0 | 8 |
| 2 | h | 8 | i | 1 | h / 8 | 0 | 8 |
| 3 | a | 1 | i̲ | 4̲ | i̲ / 4̲ | 1 | 4 |
| 4 | e | 5 | i | 1 | e / 5 | 0 | 8 |
| ... | ... | ... | ... | ... | ... | ... | ... |

※ Underlined letters are selected by Selection Unit 508
Underlined numbers are selected by Selection Unit 509

VARIABLE-LENGTH CODE DECODING APPARATUS AND METHOD

CROSS REFERENCE TO RELATED APPLICATION

This is a continuation application of PCT application No. PCT/JP2009/001298 filed on Mar. 24, 2009, designating the United States of America.

BACKGROUND OF THE INVENTION (1) Field of the Invention

The present invention relates to a variable-length code decoding apparatus and a method for decoding a bitstream containing codewords that are variable-length encoded data.

(2) Description of the Related Art

Recent years have seen marked development in compression encoding techniques for moving pictures, audio, and so on, and such techniques are being practically applied in fields such as broadcasting, communications, and storage. Variable-length encoding is a compression encoding technique that improves encoding efficiency by varying the code length based on the frequency at which values to be encoded arise. When decoding variable-length encoded data (denoted as "codewords" hereinafter), the code lengths of the codewords contained in a bitstream differ from each other, and thus it is not possible to identify the location of a given codeword. It is thus necessary to sequentially decode the codewords starting with the beginning of the bitstream. Meanwhile, with standards such as MPEG (Moving Picture Experts Group), predetermined units for decoding are specified, and a DTS (Decoding Time Stamp) is held in the header of each unit for decoding.

A variable-length code decoding apparatus disclosed in, for example, Japanese Unexamined Patent Application Publication No. H11-122113 (hereinafter referred to as Patent Reference 1) is known as a variable-length code decoding apparatus that decodes variable-length encoded codewords.

FIG. 16 is a diagram illustrating the configuration of the conventional variable-length code decoding apparatus disclosed in Patent Reference 1. The variable-length code decoding apparatus illustrated in FIG. 16 includes a video decoder 600 and a memory 700.

The video decoder 600 decodes code data of images (a bitstream) compression-encoded through an MPEG technique. The video decoder 600 includes an input interface 610, a memory interface 620, an image decompression unit 630, an output interface 640, and a controller 650.

The image decompression unit 630, meanwhile, includes a VLD (Variable Length Decoding) unit 631, an IQ (Inverse Quantization) unit 632, an IDCT (Inverse Discrete Cosine Transform) unit 633, an MVC (Motion Vector Calculation) unit 634, an MC (Motion Compensation) unit 635, a byte-word conversion unit 636, a clock control unit 637, and a parser unit 638.

The memory 700 includes a code buffer memory 710 and a frame memory 720. The code buffer memory 710 accumulates an undecoded bitstream.

The byte-word conversion unit 636 converts the undecoded bitstream accumulated in the code buffer memory 710 from byte units to word units and outputs the word units. The byte-word conversion unit 636 also outputs an underflow signal to the clock control unit 637 until a predetermined amount of the undecoded bitstream has been accumulated in the code buffer memory 710.

The clock control unit 637 does not supply a clock signal to the VLD unit 631 during the period in which the underflow signal is being outputted by the byte-word conversion unit 636.

The VLD unit 631 decodes the undecoded bitstream outputted by the byte-word conversion unit 636 using a variable-length code table during the period in which the clock signal is being supplied by the clock control unit 637.

Through the configuration described thus far, when decoding a predetermined unit for decoding, the conventional variable-length code decoding apparatus illustrated in FIG. 16 can commence the decoding at the point in time when the predetermined amount of the undecoded bitstream has been accumulated rather than waiting until a decoding start time, which makes it possible to use hardware resources in an efficient manner.

However, the aforementioned conventional variable-length code decoding apparatus has been problematic in that although the decoding can be commenced at the point in time when the predetermined amount of the undecoded bitstream has been accumulated, the decoding cannot be completed in the case where the code length of the codeword at the end of the bitstream is less than a predetermined amount.

As a result, the aforementioned conventional variable-length code decoding apparatus cannot execute decoding of the entire bitstream, and in the case where, for example, the bitstream is a moving picture, there are problems where the final picture cannot be outputted and so on. For this reason, the technique disclosed in Patent Reference 1 is, for example, applied only to the first picture, whereas normal decoding based on DTSs is executed on the pictures that follow thereafter. In other words, the conventional variable-length code decoding apparatus has not been able to be applied from the start to the end of a bitstream.

The present invention solves the aforementioned conventional problems, and it is an object thereof to provide a variable-length code decoding apparatus capable of commencing decoding at the point in time when a predetermined amount of an undecoded bitstream has been accumulated and capable of completing decoding even in the case where the code length of the codeword at the end of a bitstream is less than a predetermined amount. Through this, decoding of a bitstream can be executed prior to DTS, and decoding can be executed on the entire bitstream.

SUMMARY OF THE INVENTION

In order to achieve the aforementioned object, a variable-length code decoding apparatus according to an implementation of the present invention is a variable-length code decoding apparatus that decodes a bitstream containing variable-length encoded data, and includes: a first storage unit that stores multiple codewords used in the variable-length encoding as well as decoded data and code lengths respectively corresponding to the multiple codewords; a bit output unit that includes a buffer that accumulates the bitstream and that outputs a bit string of a first length starting from the starting bit of the undecoded bitstream accumulated in the buffer, and in the case where the length of the undecoded bitstream accumulated in the buffer is less than the first length, outputs the bit string of the first length by adding data to the end of the bit string; a first reference unit that outputs decoded data and a code length corresponding to a codeword that matches the codeword at the start of the bit string outputted by the bit output unit with reference to the first storage unit; a first determination unit that determines whether or not at least the undecoded bitstream of the first length is accumulated in the buffer; a second determination unit that determines whether or not at least the undecoded bitstream of a second length is accumulated in the buffer, the second length being shorter than the first length; and a selection unit that selects a determination result from one of the first determination unit and the second determination unit. The bit output unit sets, in the case where the determination result selected by the selection unit indicates that at least the undecoded bitstream of the first length or the second length is accumulated in the buffer, a new starting bit based on the code length outputted by the first reference unit and outputs a new bit string of the first length in accordance with the set starting bit; and the selection unit switches selections of the determination results between the first determination unit and the second determination unit based on the length of the undecoded bitstream accumulated in the buffer.

Through this, if at least the undecoded bitstream of the second length is accumulated, the bitstream can be decoded. Accordingly, decoding can be commenced at the point in time in which an undecoded bitstream greater than or equal to the first length has been accumulated, and the decoding can be completed even in the case where the code length of the codeword at the end of the bitstream is less than the first length.

In addition, the selection unit may select the determination result from the second determination unit in the case where the selection unit has selected the determination result from the first determination unit and the selected determination result does not indicate that at least the undecoded bitstream of the first length is accumulated in the buffer.

In addition, the selection unit may further select the determination result from the first determination unit in the case where the selection unit has selected the determination result from the second determination unit and the selected determination result indicates that at least the undecoded bitstream of the second length is accumulated in the buffer.

In addition, the selection unit may select the determination result from the first determination unit and the determination result from the second determination unit in an alternating manner.

In addition, the second length may be the code length outputted by the first reference unit.

In addition, the first length may be the maximum length among the multiple code lengths stored in the first storage unit.

In addition, the second length may be one bit, and the variable-length code decoding apparatus may further include an end detection unit that detects the end of the bitstream; the selection unit may select the determination result from the second determination unit in the case where the end has been detected by the end detection unit.

Through this, in the case where the end of the bitstream has been detected, if at least one bit's worth of the undecoded bitstream is accumulated, the bitstream can be decoded. Accordingly, decoding can be commenced at the point in time in which an undecoded bitstream greater than or equal to the first length has been accumulated, and the decoding can be completed even in the case where the code length of the codeword at the end of the bitstream is less than the first length.

In addition, the selection unit may select the determination result from the second determination unit in the case where a codeword indicating the end of the bitstream is contained in the bit string of the first length outputted by the bit output unit.

Through this, if a codeword indicating the end of the bitstream is contained in the bit string outputted by the bit output unit and the undecoded bitstream of at least the length from the starting bit of the undecoded bitstream to the end of the codeword is accumulated, the bitstream can be decoded. Accordingly, decoding can be commenced at the point in time in which an undecoded bitstream greater than or equal to the first length has been accumulated, and the decoding can be completed even in the case where the code length of the codeword at the end of the bitstream is less than the first length.

In addition, a variable-length code decoding apparatus according to another implementation of the present invention is variable-length code decoding apparatus that decodes a bitstream containing variable-length encoded data, and includes: a first storage unit that stores multiple codewords used in the variable-length encoding as well as decoded data and code lengths respectively corresponding to the multiple codewords; an end detection unit that detects the end of the bitstream; a data adding unit that adds data to the end of the bitstream in the case where the end has been detected by the end detection unit; a bit output unit that includes a buffer that accumulates the bitstream and that outputs a bit string of a fixed length starting from the starting bit of the undecoded bitstream accumulated in the buffer, and in the case where the length of the undecoded bitstream accumulated in the buffer is less than the fixed length, outputs the bit string of the fixed length by adding data to the end of the bit string; a first reference unit that outputs decoded data and a code length corresponding to a codeword that matches the codeword at the start of the bit string outputted by the bit output unit with reference to the first storage unit; and a first determination unit that determines whether or not at least the fixed length of the undecoded bitstream is accumulated in the buffer. The bit output unit may set, in the case where the determination result of the first determination unit indicates that at least the fixed length of the undecoded bitstream is accumulated in the buffer, a new starting bit based on the code length outputted by the first reference unit and output a new bit string of the fixed length in accordance with the set starting bit; and the data adding unit may add data of a length that is at least one bit shorter than the fixed length.

Through this, by adding data that is at least one bit shorter than the first length to the end of the bitstream, it can be ensured that the length of the accumulated undecoded bitstream is greater than or equal to the first length in the case where the codeword at the end of the bitstream is accumulated. Accordingly, decoding can be commenced at the point in time in which an undecoded bitstream greater than or equal to the first length has been accumulated, and the decoding can be completed even in the case where the code length of the codeword at the end of the bitstream is less than the first length.

In addition, the fixed length may be the maximum length among the multiple code lengths stored in the first storage unit.

In addition, the end detection unit may detect the end by detecting a codeword that indicates the end of the bitstream.

In addition, the end detection unit may detect the end by analyzing header information contained in the bitstream.

In addition, the variable-length code decoding apparatus may further include: a second storage unit that stores multiple codewords used in the variable-length encoding that are different from the codewords stored in the first storage unit as well as decoded data and code lengths respectively corresponding to the multiple codewords; a second reference unit that outputs decoded data and a code length corresponding to a codeword that matches the codeword at the start of the bit string outputted by the bit output unit with reference to the second storage unit; and a second selection unit that selects one of the first reference unit and the second reference unit. The first length may be the maximum length among the multiple code lengths stored in the storage unit referred to by the reference unit selected by the second selection unit.

Through this, if an undecoded bitstream of one of the maximum code lengths among the multiple maximum code lengths stored in the multiple storage units is accumulated, the codewords contained in the variable-length code table stored in the storage unit in which that maximum code length is stored can be decoded. Accordingly, the codewords contained in the variable-length code table having the shortest maximum code length stored in the storage unit can be decoded at a high speed.

The present invention can be realized not only as an apparatus, but also as a variable-length code decoding method that implements the various processing units of which the stated variable-length code decoding apparatus is configured as steps. Furthermore, some or all of the constituent elements of which the stated apparatuses are configured may be configured using a single system LSI (large scale integration) circuit.

The present invention can provide a variable-length code decoding apparatus capable of commencing decoding at the point in time when a predetermined amount of an undecoded bitstream has been accumulated and capable of completing decoding even in the case where the code length of the codeword at the end of a bitstream is less than a predetermined amount.

FURTHER INFORMATION ABOUT TECHNICAL BACKGROUND TO THIS APPLICATION

The disclosure of Japanese Patent Application No. 2008-091012 filed on Mar. 31, 2008 including specification, drawings and claims is incorporated herein by reference in its entirety.

The disclosure of PCT application No. PCT/JP2009/001298 filed on Mar. 24, 2009, including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIG. 3 is a diagram illustrating an example of a variable-length code table stored in a storage unit according to the first embodiment;

FIG. 4 is a diagram illustrating operations performed by the variable-length code decoding apparatus according to the first embodiment;

FIG. 5 is a diagram illustrating operations performed by the variable-length code decoding apparatus according to the first embodiment;

FIG. 6 is a diagram illustrating an example of output formats for accumulation states as outputted by the bitstream cutout unit according to the first embodiment;

FIG. 8 is a diagram illustrating operations performed by the variable-length code decoding apparatus according to the second embodiment;

FIG. 10 is a diagram illustrating operations performed by the variable-length code decoding apparatus according to the third embodiment;

FIG. 12 is a diagram illustrating operations performed by the variable-length code decoding apparatus according to the fourth embodiment;

FIG. 14 is a diagram illustrating an example of a variable-length code table stored in a storage unit according to the fifth embodiment;

FIG. 15 is a diagram illustrating operations performed by the variable-length code decoding apparatus according to the fifth embodiment.

DESCRIPTION OF THE PREFERRED EMBODIMENT(S)

Hereinafter, a variable-length code decoding apparatus according to the present invention will be described, based on embodiments, with reference to the drawings.

First Embodiment

First, the configuration of a variable-length code decoding apparatus according to the present embodiment will be described.

Figure 1:
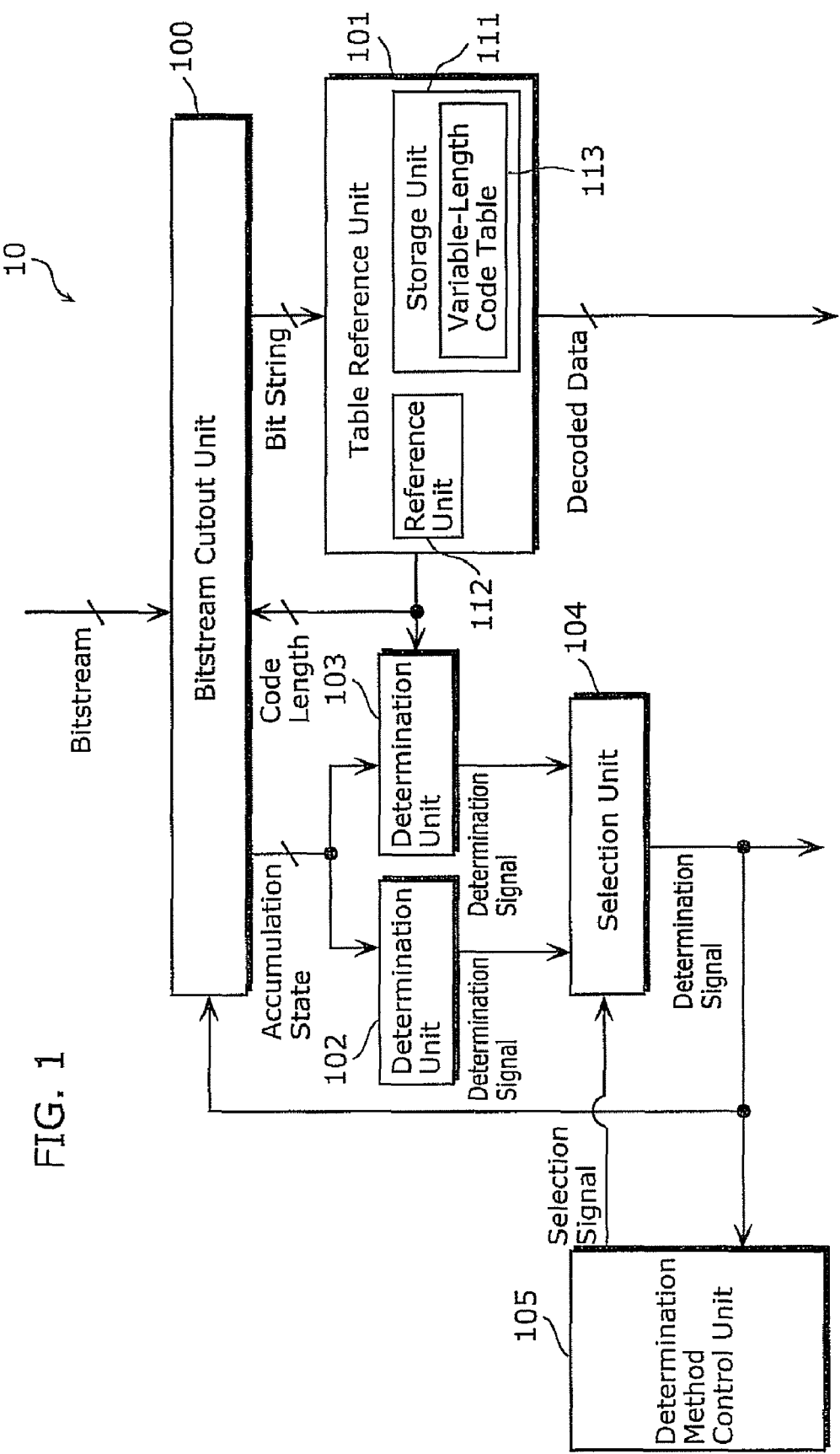
FIG. 1 is a block diagram illustrating the configuration of a variable-length code decoding apparatus according to a first embodiment.

FIG. 1 is a block diagram illustrating the configuration of the variable-length code decoding apparatus according to the present embodiment.

A variable-length code decoding apparatus 10 illustrated in FIG. 1 decodes a bitstream containing codewords that are variable-length encoded data and outputs the decoded data. The variable-length code decoding apparatus 10 includes a bitstream cutout unit 100, a table reference unit 101, determination units 102 and 103, a selection unit 104, and a determination method control unit 105. Note that in the present embodiment, the maximum code length of codewords used in the variable-length encoding is assumed to be eight bits.

The bitstream cutout unit 100 includes a buffer that accumulates an inputted bitstream, and outputs a bit string of a predetermined first length that continues from the starting bit of an undecoded bitstream accumulated in the buffer. Here, the bitstream cutout unit 100 accumulates an undecoded bitstream, and cuts out and outputs a bit string of at least the maximum code length of codewords used in variable-length encoding from the starting bit of that bitstream. To be more specific, the bitstream cutout unit 100 cuts out and outputs eight bits' worth of a bit string from the starting bit of the undecoded bitstream.

In addition, in the case where the length of the undecoded bitstream accumulated in the bitstream cutout unit 100 is less than the first length, the bitstream cutout unit 100 outputs a bit string of the first length by adding data to the end of that bit string. To be more specific, in the case where the length of the undecoded bitstream accumulated in the bitstream cutout unit 100 is less than eight bits, the bitstream cutout unit 100 adds zeroes equivalent to the insufficient amount at the end of the bit string and outputs the bit string.

In addition, the bitstream cutout unit 100 outputs the length of the undecoded bitstream accumulated in the bitstream cutout unit 100 as an accumulation state.

Furthermore, the bitstream cutout unit 100 determines a new starting bit based on a determination signal outputted by the selection unit 104, and cuts out and outputs eight bits' worth of the bit string from the determined starting bit. Note that the configuration of the bitstream cutout unit 100 will be described later with reference to FIG. 2.

The table reference unit 101 includes a storage unit 111 and a reference unit 112.

The storage unit 111 is a memory that stores a variable-length code table 113, which is a table that associates multiple codewords used in variable-length encoding, multiple pieces of decoded data, and code lengths.

By referring to the storage unit 111, the reference unit 112 outputs decoded data and a code length corresponding to a codeword that matches the codeword at the beginning of the bit string outputted by the bitstream cutout unit 100.

To be more specific, first, by referring to the variable-length code table 113, the reference unit 112 determines whether or not the codeword at the beginning of the outputted bit string matches a codeword that is stored in the storage unit 111. Then, in the case where the codeword at the start of the bit string outputted by the bitstream cutout unit 100 matches a codeword stored in the storage unit 111, the reference unit 112 outputs the decoded data and the code length corresponding to that codeword. On the other hand, in the case where the codeword at the start of the bit string outputted by the bitstream cutout unit 100 does not match a codeword stored in the storage unit 111, the reference unit 112 outputs an arbitrary piece of decoded data and an arbitrary code length.

The determination unit 102 determines whether or not an undecoded bitstream of at least the first length is accumulated in the bitstream cutout unit 100. Here, determination unit 102 determines whether or not an undecoded bitstream of at least the maximum code length of codewords used in variable-length encoding is accumulated within the bitstream cutout unit 100.

To be more specific, in the case where the accumulation state outputted by the bitstream cutout unit 100 is greater than or equal to "8", the determination unit 102 outputs a determination signal of "1". On the other hand, in the case where the accumulation state outputted by the bitstream cutout unit 100 is less than "8", the determination unit 102 outputs a determination signal of "0". Note that in the case where an undecoded bitstream that is greater than or equal to the maximum code length is accumulated in the bitstream cutout unit 100, the determination unit 102 determines that the code length and decoded data outputted by the table reference unit 101 are valid (that is, outputs a determination signal of "1"). Note also that descriptions of a determination signal of "0" indicate that a logical value of "0" is outputted as the determination signal, and the same notation will be used hereinafter.

The determination unit 103 determines whether or not an undecoded bitstream of at least a second length, which is shorter than the first length, is accumulated in the bitstream cutout unit 100. Here, the determination unit 103 determines whether or not an undecoded bitstream of at least the code length outputted by the table reference unit 101 is accumulated in the bitstream cutout unit 100.

To be more specific, in the case where the accumulation state outputted by the bitstream cutout unit 100 is greater than or equal to the code length outputted by the table reference unit 101, the determination unit 103 outputs a determination signal of "1". On the other hand, in the case where the accumulation state outputted by the bitstream cutout unit 100 is less than the code length outputted by the table reference unit 101, the determination unit 103 outputs a determination signal of "0". Note that in the case where an undecoded bitstream that is greater than or equal to the code length outputted by the table reference unit 101 is accumulated in the bitstream cutout unit 100, the determination unit 103 determines that the code length and decoded data outputted by the table reference unit 101 are valid (that is, outputs a determination signal of "1").

The selection unit 104 selects the determination result from either the determination unit 102 or the determination unit 103. In addition, the selection unit 104 switches that selection of the determination result from the determination units 102 and 103 in accordance with the length of the undecoded bitstream accumulated in the bitstream cutout unit 100. Here, the selection unit 104 selects either the determination signal outputted by the determination unit 102 or the determination signal outputted by the determination unit 103 in accordance with a selection signal outputted by the determination method control unit 105.

To be more specific, in the case where the selection signal outputted by the determination method control unit 105 is "0", the selection unit 104 selects the determination signal outputted by the determination unit 102. On the other hand, in the case where the selection signal outputted by the determination method control unit 105 is "1", the selection unit 104 selects the determination signal outputted by the determination unit 103.

The determination method control unit 105 outputs the selection signal for selecting either the determination signal outputted by the determination unit 102 or the determination signal outputted by the determination unit 103. To be more specific, in the case where the determination signal selected by the selection unit 104 is "0", the determination method control unit 105 outputs a selection signal of "1" in the next cycle. On the other hand, in the case where the determination signal selected by the selection unit 104 is "1", the determination method control unit 105 outputs a selection signal of "0" in the next cycle. Note that the selection signal of "0" is outputted in an initial state.

Note that as described above, with the variable-length code decoding apparatus 10 of the present embodiment, the determination method control unit 105 controls the selection unit 104 so that, in the case where the determination unit 102 has been selected and the selected determination result does not indicate that an undecoded bitstream of at least the first length (the maximum code length) is accumulated in the bitstream cutout unit 100, the selection unit 104 switches so as to select the determination unit 103. Furthermore, in the case where the determination unit 103 has been selected and the selected determination result indicates that an undecoded bitstream of at least the second length (the code length outputted by the table reference unit 101) is accumulated in the bitstream cutout unit 100, the selection unit 104 switches so as to select the determination unit 102.

In other words, with the variable-length code decoding apparatus 10 of the present embodiment, in the case where the determination unit 102 has determined that the code length and decoded data outputted by the table reference unit 101 is invalid, the determination method control unit 105 controls the selection unit 104 so as to select the determination unit 103 in the next cycle. Furthermore, in the case where the determination unit 103 has determined that the code length and decoded data outputted by the table reference unit 101 is valid, the determination method control unit 105 controls the selection unit 104 so as to select the determination unit 102 in the next cycle.

Accordingly, by switching between the determination units 102 and 103 as appropriate, decoding can be commenced at the point in time in which an undecoded bitstream greater than or equal to the maximum code length has been accumulated, and the decoding can be completed even in the case where the code length of the codeword at the end of the bitstream is less than the maximum code length.

Figure 2:
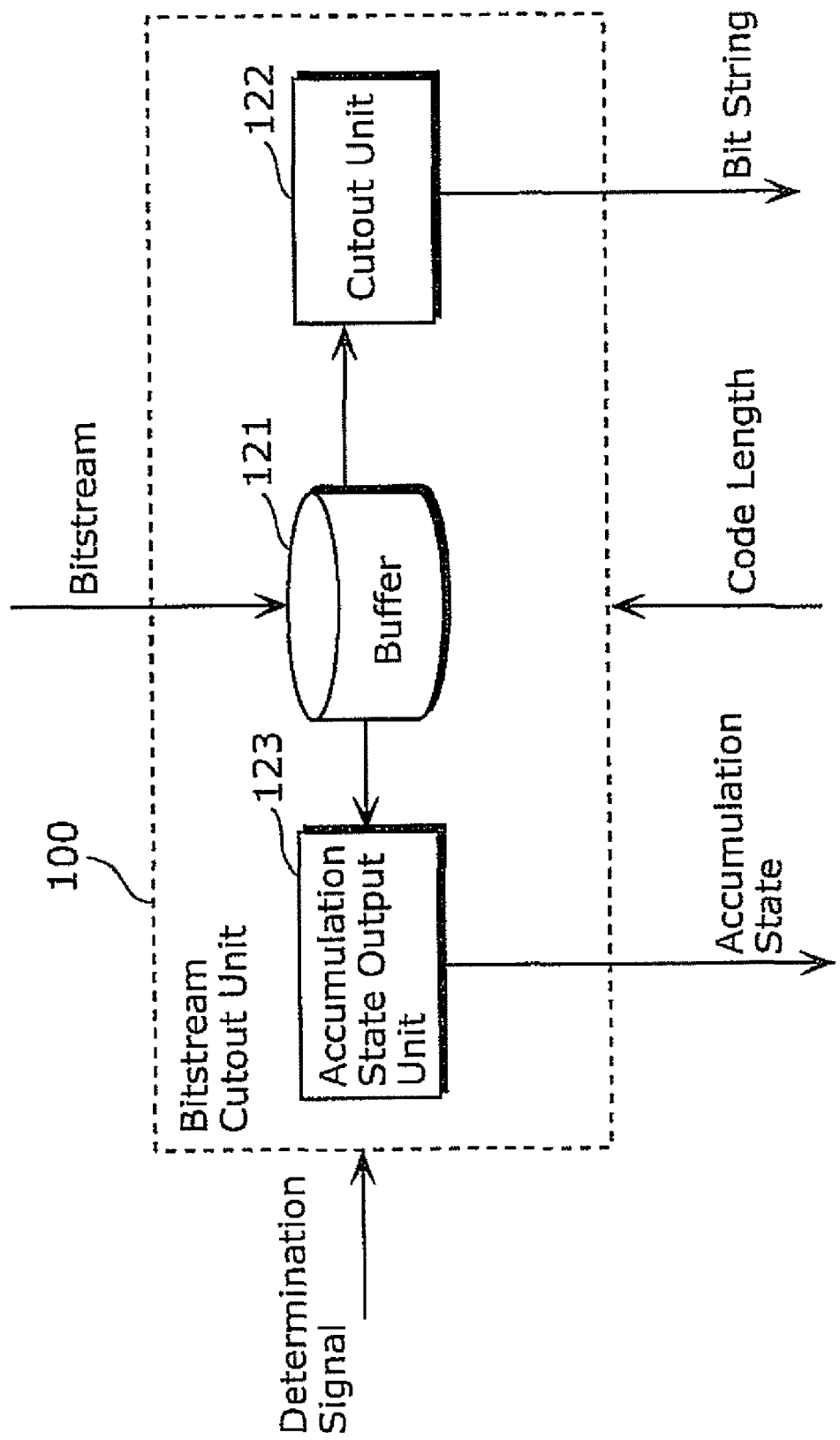
FIG. 2 is a block diagram illustrating details of a bitstream cutout unit according to the first embodiment.

FIG. 2 is a block diagram illustrating details of the bitstream cutout unit 100. As shown in FIG. 2, the bitstream cutout unit 100 includes a buffer 121, a cutout unit 122, and an accumulation state output unit 123.

The buffer 121 is a storage unit, such as a memory, that accumulates an inputted undecoded bitstream.

The cutout unit 122 cuts out and outputs eight bits' worth of a bit string from the starting bit of the undecoded bitstream accumulated in the buffer 121. At this time, in the case where the length of the undecoded bitstream accumulated in the buffer 121 is less than eight bits, the cutout unit 122 adds zeroes equivalent to the insufficient amount at the end of the bit string and outputs the bit string.

Furthermore, in the case where the determination signal selected by the selection unit 104 is "1", the cutout unit 122 determines that the code length outputted by the reference unit 112 is valid, determines a new starting bit of the undecoded bitstream based on that code length, and cuts out and outputs a bit string. To be more specific, the cutout unit 122 sets, as the new starting bit, the bit that is located one bit further than the code length from the starting bit of the undecoded bitstream accumulated in the buffer 121. In other words, the bitstream that comes before the new starting bit is a decoded bitstream, whereas the bitstream that follows the new starting bit is a new, undecoded bitstream.

Meanwhile, in the case where the determination signal selected by the selection unit 104 is "0", the cutout unit 122 determines that the code length outputted by the reference unit 112 is invalid, and does not determine a new starting bit of the bitstream.

The accumulation state output unit 123 outputs the length of the undecoded bitstream accumulated in the buffer 121 as an accumulation state.

FIG. 3 is a diagram illustrating an example of the variable-length code table 113 stored in the storage unit 111. As shown in FIG. 3, the variable-length code table 113 stored in the storage unit 111 associates codewords, decoded data of codewords, and code lengths, which are the lengths of the code of the codewords. Note that the variable-length code table 113 stored in the storage unit 111 is a variable-length code table whose maximum code length is eight bits.

Next, operations performed by the variable-length code decoding apparatus 10 according to the present embodiment will be described.

FIG. 4 is a diagram illustrating specific operations performed by the variable-length code decoding apparatus 10. Hereinafter, an operation whereby the variable-length code decoding apparatus 10 decodes a bitstream of "11111110111010" will be described. Here, as an example, it is assumed that a bitstream is inputted into the bitstream cutout unit 100 four bits at a time. Note that the underlined numbers (determination signals) shown in the columns of the determination units 102 and 103 in FIG. 4 are numbers (determination signals) selected by the selection unit 104.

<First Cycle>

In a first cycle, the first through fourth bits of the bitstream "11111110111010", or "1111", are inputted into the variable-length code decoding apparatus 10.

The bitstream cutout unit 100 accumulates the inputted bitstream "1111" and outputs an accumulation state of "4". Meanwhile, because the length of the undecoded bitstream accumulated in the bitstream cutout unit 100 is less than eight bits, the bitstream cutout unit 100 adds zeroes equivalent to the insufficient amount at the end of the bit string, and thus outputs a bit string of "11110000".

Because the first through fifth bits of the bit string "11110000" outputted by the bitstream cutout unit 100, or "11110", match the codeword "11110" stored in the storage unit 111, the table reference unit 101 outputs decoded data "e" and a code length of "5".

Because the accumulation state of "4" outputted by the bitstream cutout unit 100 is less than "8", the determination unit 102 outputs a determination signal of "0".

Meanwhile, because the accumulation state of "4" outputted by the bitstream cutout unit 100 is less than the code length of "5" outputted by the table reference unit 101, the determination unit 103 outputs the determination signal "0".

Furthermore, because the selection signal outputted by the determination method control unit 105 is "0" (the initial state), the selection unit 104 selects the determination signal "0" outputted by the determination unit 102.

Furthermore, because the determination signal selected by the selection unit 104 is "0", the determination method control unit 105 outputs a selection signal of "1" in the next cycle (a second cycle).

Finally, because the determination signal selected by the selection unit 104 is "0", the bitstream cutout unit 100 determines that the code length of "5" outputted by the table reference unit 101 is invalid, and thus does not determine a new starting bit of the undecoded bitstream based on that code length.

<Second Cycle>

In the second cycle, the fifth through eighth bits of the bitstream "11111110111010", or "1110", are inputted into the variable-length code decoding apparatus 10.

The bitstream cutout unit 100 accumulates the inputted bitstream "1110" and outputs an accumulation state of "8". Meanwhile, because the length of the undecoded bitstream accumulated in the bitstream cutout unit 100 is greater than or equal to eight bits, the bitstream cutout unit 100 cuts out eight bits' worth of a bit string from the starting bit of the bitstream, and outputs a bit string "11111110".

Because the bit string "11111110" outputted by the bitstream cutout unit 100 matches the codeword "11111110" stored in the storage unit 111, the table reference unit 101 outputs decoded data "h" and a code length of "8".

Because the accumulation state of "8" outputted by the bitstream cutout unit 100 is greater than or equal to "8", the determination unit 102 outputs a determination signal of "1".

Meanwhile, because the accumulation state of "8" outputted by the bitstream cutout unit 100 is greater than or equal to the code length of "8" outputted by the table reference unit 101, the determination unit 103 outputs the determination signal "1".

Furthermore, because the selection signal outputted by the determination method control unit 105 is "1", the selection unit 104 selects the determination signal "1" outputted by the determination unit 103.

Furthermore, because the determination signal selected by the selection unit 104 is "1", the determination method control unit 105 outputs a selection signal of "0" in the next cycle (a third cycle).

Finally, because the determination signal selected by the selection unit 104 is "1", the bitstream cutout unit 100 determines that the code length of "8" outputted by the table reference unit 101 is valid, determines a new starting bit of the undecoded bitstream based on that code length, and cuts out and outputs the bit string to be decoded in the next cycle. Here, the bitstream cutout unit 100 sets the bit following the "11111110" as the new starting bit.

<Third Cycle>

In the third cycle, the ninth through twelfth bits of the bitstream "11111110111010", or "1110", are inputted into the variable-length code decoding apparatus 10.

The bitstream cutout unit 100 accumulates the inputted bitstream "1110" and outputs an accumulation state of "4". Meanwhile, because the length of the undecoded bitstream accumulated in the bitstream cutout unit 100 is less than eight bits, the bitstream cutout unit 100 adds zeroes equivalent to the insufficient amount at the end of the bit string, and thus outputs a bit string of "11100000".

Because the first through fourth bits of the bit string "11100000" outputted by the bitstream cutout unit 100, or "1110", match the codeword "1110" stored in the storage unit 111, the table reference unit 101 outputs decoded data "d" and a code length of "4".

Because the accumulation state of "4" outputted by the bitstream cutout unit 100 is less than "8", the determination unit 102 outputs a determination signal of "0".

Meanwhile, because the accumulation state of "4" outputted by the bitstream cutout unit 100 is greater than or equal to the code length of "4" outputted by the table reference unit 101, the determination unit 103 outputs the determination signal "1".

Furthermore, because the selection signal outputted by the determination method control unit 105 is "0", the selection unit 104 selects the determination signal "0" outputted by the determination unit 102.

Furthermore, because the determination signal selected by the selection unit 104 is "0", the determination method control unit 105 outputs a selection signal of "1" in the next cycle (a fourth cycle).

Finally, because the determination signal selected by the selection unit 104 is "0", the bitstream cutout unit 100 determines that the code length of "4" outputted by the table reference unit 101 is invalid, and thus does not determine a new starting bit of the undecoded bitstream based on that code length.

<Fourth Cycle>

In the fourth cycle, the thirteenth and fourteenth bits of the bitstream "11111110111010", or "10", are inputted into the variable-length code decoding apparatus 10.

The bitstream cutout unit 100 accumulates the inputted bitstream "10" and outputs an accumulation state of "6". Meanwhile, because the length of the undecoded bitstream accumulated in the bitstream cutout unit 100 is less than eight bits, the bitstream cutout unit 100 adds zeroes equivalent to the insufficient amount at the end of the bit string, and thus outputs a bit string of "11101000".

Because the first through fourth bits of the bit string "11101000" outputted by the bitstream cutout unit 100, or "1110", match the codeword "1110" stored in the storage unit 111, the table reference unit 101 outputs decoded data "d" and a code length of "4".

Because the accumulation state of "6" outputted by the bitstream cutout unit 100 is less than "8", the determination unit 102 outputs a determination signal of "0".

Meanwhile, because the accumulation state of "6" outputted by the bitstream cutout unit 100 is greater than or equal to the code length of "4" outputted by the table reference unit 101, the determination unit 103 outputs the determination signal "1".

Furthermore, because the selection signal outputted by the determination method control unit 105 is "1", the selection unit 104 selects the determination signal "1" outputted by the determination unit 103.

Furthermore, because the determination signal selected by the selection unit 104 is "1", the determination method control unit 105 outputs a selection signal of "0" in the next cycle (a fifth cycle).

Finally, because the determination signal selected by the selection unit 104 is "1", the bitstream cutout unit 100 determines that the code length of "4" outputted by the table reference unit 101 is valid, determines a new starting bit of the undecoded bitstream based on that code length, and cuts out and outputs the bit string to be decoded in the next cycle. Here, the bitstream cutout unit 100 sets the bit following the "1110", or "1", as the new starting bit.

<Fifth Cycle>

In the fifth cycle, a bitstream is not inputted into the variable-length code decoding apparatus 10.

Because a bitstream is not inputted, the bitstream cutout unit 100 does not accumulate a bitstream, and thus outputs an accumulation state of "2". Meanwhile, because the length of the undecoded bitstream accumulated in the bitstream cutout unit 100 is less than eight bits, the bitstream cutout unit 100 adds zeroes equivalent to the insufficient amount at the end of the bit string, and thus outputs a bit string of "10000000".

Because the first and second bits of the bit string "10000000" outputted by the bitstream cutout unit 100, or "10", match the codeword "10" stored in the storage unit 111, the table reference unit 101 outputs decoded data "b" and a code length of "2".

Because the accumulation state of "2" outputted by the bitstream cutout unit 100 is less than "8", the determination unit 102 outputs a determination signal of "0".

Meanwhile, because the accumulation state of "2" outputted by the bitstream cutout unit 100 is greater than or equal to the code length of "2" outputted by the table reference unit 101, the determination unit 103 outputs the determination signal "1".

Furthermore, because the selection signal outputted by the determination method control unit 105 is "0", the selection unit 104 selects the determination signal "0" outputted by the determination unit 102.

Furthermore, because the determination signal selected by the selection unit 104 is "0", the determination method control unit 105 outputs a selection signal of "1" in the next cycle (a sixth cycle).

Finally, because the determination signal selected by the selection unit 104 is "0", the bitstream cutout unit 100 determines that the code length of "2" outputted by the table reference unit 101 is invalid, and thus does not determine a new starting bit of the undecoded bitstream based on that code length.

<Sixth Cycle>

In the sixth cycle, a bitstream is not inputted into the variable-length code decoding apparatus 10.

Because a bitstream is not inputted, the bitstream cutout unit 100 does not accumulate a bitstream, and thus outputs an accumulation state of "2". Meanwhile, because the length of the undecoded bitstream accumulated in the bitstream cutout unit 100 is less than eight bits, the bitstream cutout unit 100 adds zeroes equivalent to the insufficient amount at the end of the bit string, and thus outputs a bit string of "10000000".

Because the first and second bits of the bit string "10000000" outputted by the bitstream cutout unit 100, or "10", match the codeword "10" stored in the storage unit 111, the table reference unit 101 outputs decoded data "b" and a code length of "2".

Because the accumulation state of "2" outputted by the bitstream cutout unit 100 is less than "8", the determination unit 102 outputs a determination signal of "0".

Meanwhile, because the accumulation state of "2" outputted by the bitstream cutout unit 100 is greater than or equal to the code length of "2" outputted by the table reference unit 101, the determination unit 103 outputs the determination signal "1".

Furthermore, because the selection signal outputted by the determination method control unit 105 is "1", the selection unit 104 selects the determination signal "1" outputted by the determination unit 103.

Furthermore, because the determination signal selected by the selection unit 104 is "1", the determination method control unit 105 outputs a selection signal of "0" in the next cycle (a seventh cycle).

Finally, because the determination signal selected by the selection unit 104 is "1", the bitstream cutout unit 100 determines that the code length of "2" outputted by the table reference unit 101 is valid, determines a new starting bit of the undecoded bitstream based on that code length, and cuts out and outputs the bit string to be decoded in the next cycle.

As described thus far, if an undecoded bitstream of at least the code length outputted by the table reference unit 101 is accumulated in the bitstream cutout unit 100, the variable-length code decoding apparatus 10 of the present embodiment can decode the bitstream even if an undecoded bitstream greater than or equal to eight bits is not accumulated. Accordingly, decoding can be commenced at the point in time in which an undecoded bitstream greater than or equal to eight bits has been accumulated, and the decoding can be completed even in the case where the code length of the codeword at the end of the bitstream is less than eight bits.

FIG. 5 is a diagram illustrating specific operations performed by the variable-length code decoding apparatus 10. Hereinafter, an operation whereby the variable-length code decoding apparatus 10 decodes a bitstream of "11101110 . . . " will be described. Here, as an example, it is assumed that a bitstream is inputted into the bitstream cutout unit 100 two bits at a time. Note that the underlined numbers (determination signals) shown in the columns of the determination units 102 and 103 in FIG. 5 are numbers (determination signals) selected by the selection unit 104.

<First Cycle>

In a first cycle, the first and second bits of the bitstream "11101110 . . . ", or "11", are inputted into the variable-length code decoding apparatus 10.

The bitstream cutout unit 100 accumulates the inputted bitstream "11" and outputs an accumulation state of "2". Meanwhile, because the length of the undecoded bitstream accumulated in the bitstream cutout unit 100 is less than eight bits, the bitstream cutout unit 100 adds zeroes equivalent to the insufficient amount at the end of the bit string, and thus outputs a bit string of "11000000".

Because the first through third bits of the bit string "11000000" outputted by the bitstream cutout unit 100, or "110", match the codeword "110" stored in the storage unit 111, the table reference unit 101 outputs decoded data "c" and a code length of "3".

Because the accumulation state of "2" outputted by the bitstream cutout unit 100 is less than "8", the determination unit 102 outputs a determination signal of "0".

Meanwhile, because the accumulation state of "2" outputted by the bitstream cutout unit 100 is less than the code length of "3" outputted by the table reference unit 101, the determination unit 103 outputs the determination signal "0".

Furthermore, because the selection signal outputted by the determination method control unit 105 is "0" (the initial state), the selection unit 104 selects the determination signal "0" outputted by the determination unit 102.

Furthermore, because the determination signal selected by the selection unit 104 is "0", the determination method control unit 105 outputs a selection signal of "1" in the next cycle (a second cycle).

Finally, because the determination signal selected by the selection unit 104 is "0", the bitstream cutout unit 100 determines that the code length of "3" outputted by the table reference unit 101 is invalid, and thus does not determine a new starting bit of the undecoded bitstream based on that code length.

<Second Cycle>

In the second cycle, the third and fourth bits of the bitstream "11101110 . . . ", or "10", are inputted into the variable-length code decoding apparatus 10.

The bitstream cutout unit 100 accumulates the inputted bitstream "10" and outputs an accumulation state of "4". Meanwhile, because the length of the undecoded bitstream accumulated in the bitstream cutout unit 100 is less than eight bits, the bitstream cutout unit 100 adds zeroes equivalent to the insufficient amount at the end of the bit string, and thus outputs a bit string of "11100000".

Because the first through fourth bits of the bit string "11100000" outputted by the bitstream cutout unit 100, or "1110", match the codeword "1110" stored in the storage unit 111, the table reference unit 101 outputs decoded data "d" and a code length of "4".

Because the accumulation state of "4" outputted by the bitstream cutout unit 100 is less than "8", the determination unit 102 outputs a determination signal of "0".

Meanwhile, because the accumulation state of "4" outputted by the bitstream cutout unit 100 is greater than or equal to the code length of "4" outputted by the table reference unit 101, the determination unit 103 outputs the determination signal "1".

Furthermore, because the selection signal outputted by the determination method control unit 105 is "1", the selection unit 104 selects the determination signal "1" outputted by the determination unit 103.

Furthermore, because the determination signal selected by the selection unit 104 is "1", the determination method control unit 105 outputs a selection signal of "0" in the next cycle (a third cycle).

Finally, because the determination signal selected by the selection unit 104 is "1", the bitstream cutout unit 100 determines that the code length of "4" outputted by the table reference unit 101 is valid, determines a new starting bit of the undecoded bitstream based on that code length, and cuts out and outputs the bit string to be decoded in the next cycle. Here, the bitstream cutout unit 100 sets the bit following the "1110" as the new starting bit.

As described thus far, if an undecoded bitstream of at least the code length outputted by the table reference unit 101 is accumulated in the bitstream cutout unit 100, the variable-length code decoding apparatus 10 of the present embodiment can decode the bitstream even if an undecoded bitstream greater than or equal to eight bits is not accumulated. Through this, the decoding can be completed even in the case where the code length of the codeword at the end of the bitstream is less than eight bits, and furthermore, a codeword whose code length is less than eight bits can be decoded at a high speed.

Although the foregoing describes the bitstream cutout unit 100 as outputting the length of an accumulated undecoded bitstream as the accumulation state, it should be noted that an output format 1 or 2, as shown in FIG. 6, may be outputted. To be more specific, with the output format 1, an accumulation state of "8" is outputted in the case where the length of the accumulated undecoded bitstream is greater than or equal to eight bits. Meanwhile, assuming the accumulation state has a length of eight bits and each bit of the accumulation state corresponds to a respective bit in the bit string outputted by the bitstream cutout unit 100, the output format 2 indicates whether or not the bits in that bit string are accumulated.

Furthermore, although the foregoing describes the bitstream cutout unit 100 as adding zeroes equivalent to the insufficient amount at the end of the bit string in the case where the length of the accumulated undecoded bitstream is less than eight bits, any given data aside from zeroes may be added instead.

In addition, the length of the bit string outputted by the bitstream cutout unit 100 may be a predetermined fixed length. In other words, the bitstream cutout unit 100 may output a bit string of a fixed length following the starting bit of the undecoded bitstream accumulated in the bitstream cutout unit 100. At this time, the determination unit 102 determines whether or not an undecoded bitstream of at least the fixed length is accumulated in the bitstream cutout unit 100.

In addition, the determination method control unit 105 may control the selection unit 104 so as to alternately switch between selecting the determination unit 102 and the determination unit 103 with each cycle.

Furthermore, although the foregoing describes the storage unit 111 as storing a variable-length code table with a maximum code length of eight bits, the storage unit 111 may store a variable-length code table with any given maximum code length aside from eight bits.

Second Embodiment

First, the configuration of a variable-length code decoding apparatus according to the present embodiment will be described.

Figure 7:
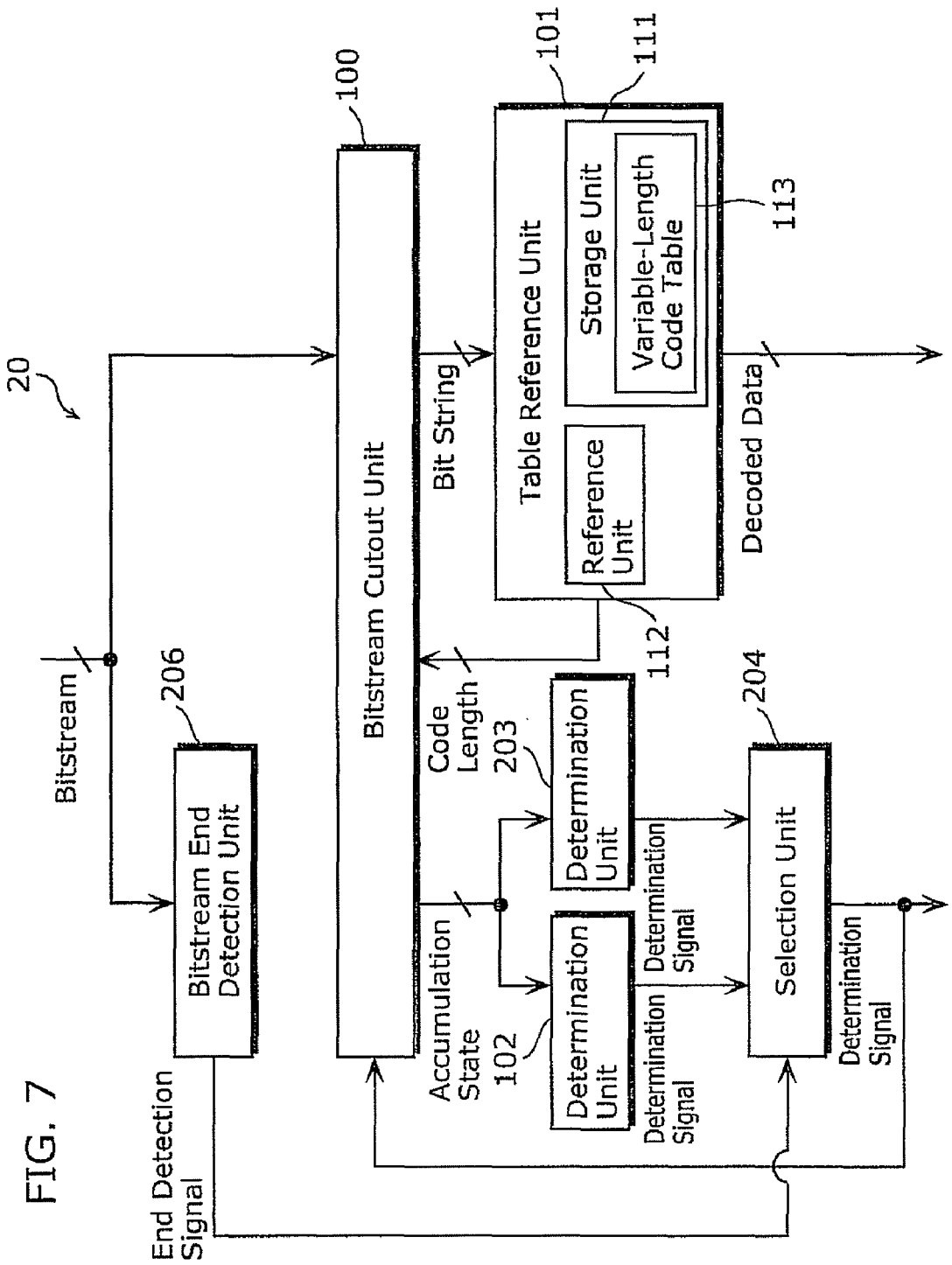
FIG. 7 is a block diagram illustrating the configuration of a variable-length code decoding apparatus according to a second embodiment.

FIG. 7 is a block diagram illustrating the configuration of a variable-length code decoding apparatus 20 according to the present embodiment. Note that identical reference numerals are assigned to the same constituent elements as those shown in FIG. 1, and redundant descriptions thereof will be omitted.

The variable-length code decoding apparatus 20 illustrated in FIG. 7 decodes a bitstream containing codewords that are variable-length encoded data and outputs the decoded data. The variable-length code decoding apparatus 20 includes a bitstream cutout unit 100, a table reference unit 101, determination units 102 and 203, a selection unit 204, and a bitstream end detection unit 206. The variable-length code decoding apparatus 20 differs from the variable-length code decoding apparatus 10 of the first embodiment in that the determination method control unit 105 has been removed, the determination unit 103 has been replaced with the determination unit 203, the selection unit 104 has been replaced with the selection unit 204, and the bitstream end detection unit 206 has been added.

The determination unit 203 determines whether or not an undecoded bitstream of at least a second length, which is shorter than a first length, is accumulated in the bitstream cutout unit 100. Here, the determination unit 203 determines whether or not at least one bit's worth of an undecoded bitstream is accumulated in the bitstream cutout unit 100. To be more specific, in the case where an accumulation state outputted by the bitstream cutout unit 100 is greater than or equal to "1", the determination unit 203 outputs a determination signal of "1". On the other hand, in the case where the accumulation state outputted by the bitstream cutout unit 100 is less than "1", the determination unit 203 outputs a determination signal of "0".

The selection unit 204 selects the determination result of the determination unit 203 in the case where the end of the bitstream has been detected by the bitstream end detection unit 206. Here, the selection unit 204 selects either the determination signal outputted by the determination unit 102 or the determination signal outputted by the determination unit 203 in accordance with an end detection signal outputted by the bitstream end detection unit 206. To be more specific, in the case where the end detection signal outputted by the bitstream end detection unit 206 is "0", the selection unit 204 selects the determination signal outputted by the determination unit 102. On the other hand, in the case where the end detection signal outputted by the bitstream end detection unit 206 is "1", the selection unit 204 selects the determination signal outputted by the determination unit 203.

The bitstream end detection unit 206 detects the end of an inputted bitstream. To be more specific, the bitstream end detection unit 206 detects a codeword indicating the end of the bitstream, or detects the end of the bitstream by analyzing header information. Note that the bitstream end detection unit 206 continues to output an end detection signal of "0" until the end of the bitstream is detected. The bitstream end detection unit 206 outputs an end detection signal of "1" after the end of the bitstream has been detected.

In the case where the determination signal selected by the selection unit 204 is "1", the bitstream cutout unit 100 determines that the code length outputted by the reference unit 112 is valid, determines a new starting bit of the undecoded bitstream based on that code length, and cuts out and outputs a bit string. To be more specific, the bitstream cutout unit 100 sets, as the new starting bit, the bit that is located one bit further than the code length from the starting bit of the undecoded bitstream accumulated in the buffer 121. In other words, the bitstream that comes before the new starting bit is a decoded bitstream, whereas the bitstream that follows the new starting bit is a new, undecoded bitstream. On the other hand, in the case where the determination signal selected by the selection unit 204 is "0", the bitstream cutout unit 100 determines that the code length outputted by the reference unit 112 is invalid, and thus does not determine a new starting bit of the undecoded bitstream based on that code length.

As described thus far, in the case where an undecoded bitstream of at least one bit's worth is accumulated in the bitstream cutout unit 100, the determination unit 203 determines that the code length and decoded data outputted by the table reference unit 101 are valid (that is, outputs a determination signal of "1"). The variable-length code decoding apparatus 20 of the present embodiment includes the determination unit 203, and is can thus execute the decoding of the bitstream in the case where at least one bit's worth of the undecoded bitstream is accumulated in the bitstream cutout unit 100.

However, the determination by the determination unit 203 lacks reliability unless the end of the bitstream has been identified, and thus the determination by the determination unit 102 is executed until the end of the bitstream is detected. In other words, the selection unit 204 selects the determination unit 102 until the end of the bitstream has been detected by the bitstream end detection unit 206. After the bitstream end detection unit 206 has detected the end of the bitstream, the determination unit 203 is selected.

Accordingly, by switching from the determination unit 102 to the determination unit 203 in the case where the end of the bitstream has been detected, decoding can be commenced at the point in time in which an undecoded bitstream greater than or equal to the maximum code length has been accumulated, and the decoding can be completed even in the case where the code length of the codeword at the end of the bitstream is less than the maximum code length.

Next, operations performed by the variable-length code decoding apparatus 20 according to the present embodiment will be described.

FIG. 8 is a diagram illustrating specific operations performed by the variable-length code decoding apparatus 20. Hereinafter, an operation whereby the variable-length code decoding apparatus 20 decodes a bitstream of "11111110111010" will be described. Here, as an example, the bitstream is inputted into the bitstream cutout unit 100 and the bitstream end detection unit 206 four bits at a time. Note that the underlined numbers (determination signals) shown in the columns of the determination units 102 and 203 in FIG. 8 are numbers (determination signals) selected by the selection unit 204.

<First Cycle>

In a first cycle, the first through fourth bits of the bitstream "11111110111010", or "1111", are inputted into the variable-length code decoding apparatus 20.

Because the bitstream end detection unit 206 has not detected the end of the bitstream, the bitstream end detection unit 206 outputs an end detection signal of "0".

The bitstream cutout unit 100 accumulates the inputted bitstream "1111" and outputs an accumulation state of "4". Meanwhile, because the length of the undecoded bitstream accumulated in the bitstream cutout unit 100 is less than eight bits, the bitstream cutout unit 100 adds zeroes equivalent to the insufficient amount at the end of the bit string, and thus outputs a bit string of "11110000".

Because the first through fifth bits of the bit string "11110000" outputted by the bitstream cutout unit 100, or "11110", match the codeword "11110" stored in the storage unit 111, the table reference unit 101 outputs decoded data "e" and a code length of "5".

Because the accumulation state of "4" outputted by the bitstream cutout unit 100 is less than "8", the determination unit 102 outputs a determination signal of "0".

Because the accumulation state of "4" outputted by the bitstream cutout unit 100 is greater than or equal to "1", the determination unit 203 outputs a determination signal of "1".

Meanwhile, because the end detection signal outputted by the bitstream end detection unit 206 is "0", the selection unit 204 selects the determination signal "0" outputted by the determination unit 102.

Finally, because the determination signal selected by the selection unit 204 is "0", the bitstream cutout unit 100 determines that the code length of "5" outputted by the table reference unit 101 is invalid, and thus does not determine a new starting bit of the undecoded bitstream based on that code length.

<Second Cycle>

In a second cycle, the fifth through eighth bits of the bitstream "11111110111010", or "1110", are inputted into the variable-length code decoding apparatus 20.

Because the bitstream end detection unit 206 has not detected the end of the bitstream, the bitstream end detection unit 206 outputs an end detection signal of "0".

The bitstream cutout unit 100 accumulates the inputted bitstream "1110" and outputs an accumulation state of "8". Meanwhile, because the length of the undecoded bitstream accumulated in the bitstream cutout unit 100 is greater than or equal to eight bits, the bitstream cutout unit 100 cuts out eight bits' worth of a bit string from the starting bit of the bitstream, and outputs a bit string "11111110".

Because the bit string "11111110" outputted by the bitstream cutout unit 100 matches the codeword "11111110" stored in the storage unit 111, the table reference unit 101 outputs decoded data "h" and a code length of "8".

Because the accumulation state of "8" outputted by the bitstream cutout unit 100 is greater than or equal to "8", the determination unit 102 outputs a determination signal of "1".

Because the accumulation state of "8" outputted by the bitstream cutout unit 100 is greater than or equal to "1", the determination unit 203 outputs a determination signal of "1".

Meanwhile, because the end detection signal outputted by the bitstream end detection unit 206 is "0", the selection unit 204 selects the determination signal "1" outputted by the determination unit 102.

Finally, because the determination signal selected by the selection unit 204 is "1", the bitstream cutout unit 100 determines that the code length of "8" outputted by the table reference unit 101 is valid, determines a new starting bit of the undecoded bitstream based on that code length, and cuts out and outputs the bit string to be decoded in the next cycle. Here, the bitstream cutout unit 100 sets the bit following the "11111110" as the new starting bit.

<Third Cycle>

In a third cycle, the ninth through twelfth bits of the bitstream "11111110111010", or "1110", are inputted into the variable-length code decoding apparatus 20.

Because the bitstream end detection unit 206 has not detected the end of the bitstream, the bitstream end detection unit 206 outputs an end detection signal of "0".

The bitstream cutout unit 100 accumulates the inputted bitstream "1110" and outputs an accumulation state of "4". Meanwhile, because the length of the undecoded bitstream accumulated in the bitstream cutout unit 100 is less than eight bits, the bitstream cutout unit 100 adds zeroes equivalent to the insufficient amount at the end of the bit string, and thus outputs a bit string of "11100000".

Because the first through fourth bits of the bit string "11100000" outputted by the bitstream cutout unit 100, or "1110", match the codeword "1110" stored in the storage unit 111, the table reference unit 101 outputs decoded data "d" and a code length of "4".

Because the accumulation state of "4" outputted by the bitstream cutout unit 100 is less than "8", the determination unit 102 outputs a determination signal of "0".

Because the accumulation state of "4" outputted by the bitstream cutout unit 100 is greater than or equal to "1", the determination unit 203 outputs a determination signal of "1".

Meanwhile, because the end detection signal outputted by the bitstream end detection unit 206 is "0", the selection unit 204 selects the determination signal "0" outputted by the determination unit 102.

Finally, because the determination signal selected by the selection unit 204 is "0", the bitstream cutout unit 100 determines that the code length of "4" outputted by the table reference unit 101 is invalid, and thus does not determine a new starting bit of the undecoded bitstream based on that code length.

<Fourth Cycle>

In a fourth cycle, the thirteenth and fourteenth bits of the bitstream "11111110111010", or "10", are inputted into the variable-length code decoding apparatus 20.

Because the bitstream end detection unit 206 has detected the end of the bitstream, the bitstream end detection unit 206 outputs an end detection signal of "1".

The bitstream cutout unit 100 accumulates the inputted bitstream "10" and outputs an accumulation state of "6". Meanwhile, because the length of the undecoded bitstream accumulated in the bitstream cutout unit 100 is less than eight bits, the bitstream cutout unit 100 adds zeroes equivalent to the insufficient amount at the end of the bit string, and thus outputs a bit string of "11101000".

Because the first through fourth bits of the bit string "11101000" outputted by the bitstream cutout unit 100, or "1110", match the codeword "1110" stored in the storage unit 111, the table reference unit 101 outputs decoded data "d" and a code length of "4".

Because the accumulation state of "6" outputted by the bitstream cutout unit 100 is less than "8", the determination unit 102 outputs a determination signal of "0".

Because the accumulation state of "6" outputted by the bitstream cutout unit 100 is greater than or equal to "1", the determination unit 203 outputs a determination signal of "1".

Meanwhile, because the end detection signal outputted by the bitstream end detection unit 206 is "1", the selection unit 204 selects the determination signal "1" outputted by the determination unit 203.

Finally, because the determination signal selected by the selection unit 204 is "1", the bitstream cutout unit 100 determines that the code length of "4" outputted by the table reference unit 101 is valid, determines a new starting bit of the undecoded bitstream based on that code length, and cuts out and outputs the bit string to be decoded in the next cycle. Here, the bitstream cutout unit 100 sets the bit following the "1110", or "1", as the new starting bit.

<Fifth Cycle>

In a fifth cycle, a bitstream is not inputted into the variable-length code decoding apparatus 20.

Because the bitstream end detection unit 206 detected the end of the bitstream in the fourth cycle, the bitstream end detection unit 206 outputs an end detection signal of "1".

Because a bitstream is not inputted, the bitstream cutout unit 100 does not accumulate a bitstream, and thus outputs an accumulation state of "2". Meanwhile, because the length of the undecoded bitstream accumulated in the bitstream cutout unit 100 is less than eight bits, the bitstream cutout unit 100 adds zeroes equivalent to the insufficient amount at the end of the bit string, and thus outputs a bit string of "10000000".

Because the first and second bits of the bit string "10000000" outputted by the bitstream cutout unit 100, or "10", match the codeword "10" stored in the storage unit 111, the table reference unit 101 outputs decoded data "b" and a code length of "2".

Because the accumulation state of "2" outputted by the bitstream cutout unit 100 is less than "8", the determination unit 102 outputs a determination signal of "0".

Because the accumulation state of "2" outputted by the bitstream cutout unit 100 is greater than or equal to "1", the determination unit 203 outputs a determination signal of "1".

Meanwhile, because the end detection signal outputted by the bitstream end detection unit 206 is "1", the selection unit 204 selects the determination signal "1" outputted by the determination unit 203.

Finally, because the determination signal selected by the selection unit 204 is "1", the bitstream cutout unit 100 determines that the code length of "2" outputted by the table reference unit 101 is valid, determines a new starting bit of the undecoded bitstream based on that code length, and cuts out and outputs the bit string to be decoded in the next cycle.

As described thus far, in the case where the end of the bitstream has been detected by the bitstream end detection unit 206, if an undecoded bitstream of at least one bit's worth is accumulated in the bitstream cutout unit 100, the variable-length code decoding apparatus 20 of the present embodiment can decode the bitstream even if an undecoded bitstream greater than or equal to eight bits is not accumulated. Accordingly, decoding can be commenced at the point in time in which an undecoded bitstream greater than or equal to eight bits has been accumulated, and the decoding can be completed even in the case where the code length of the codeword at the end of the bitstream is less than eight bits.

Third Embodiment

First, the configuration of a variable-length code decoding apparatus according to the present embodiment will be described.

Figure 9:
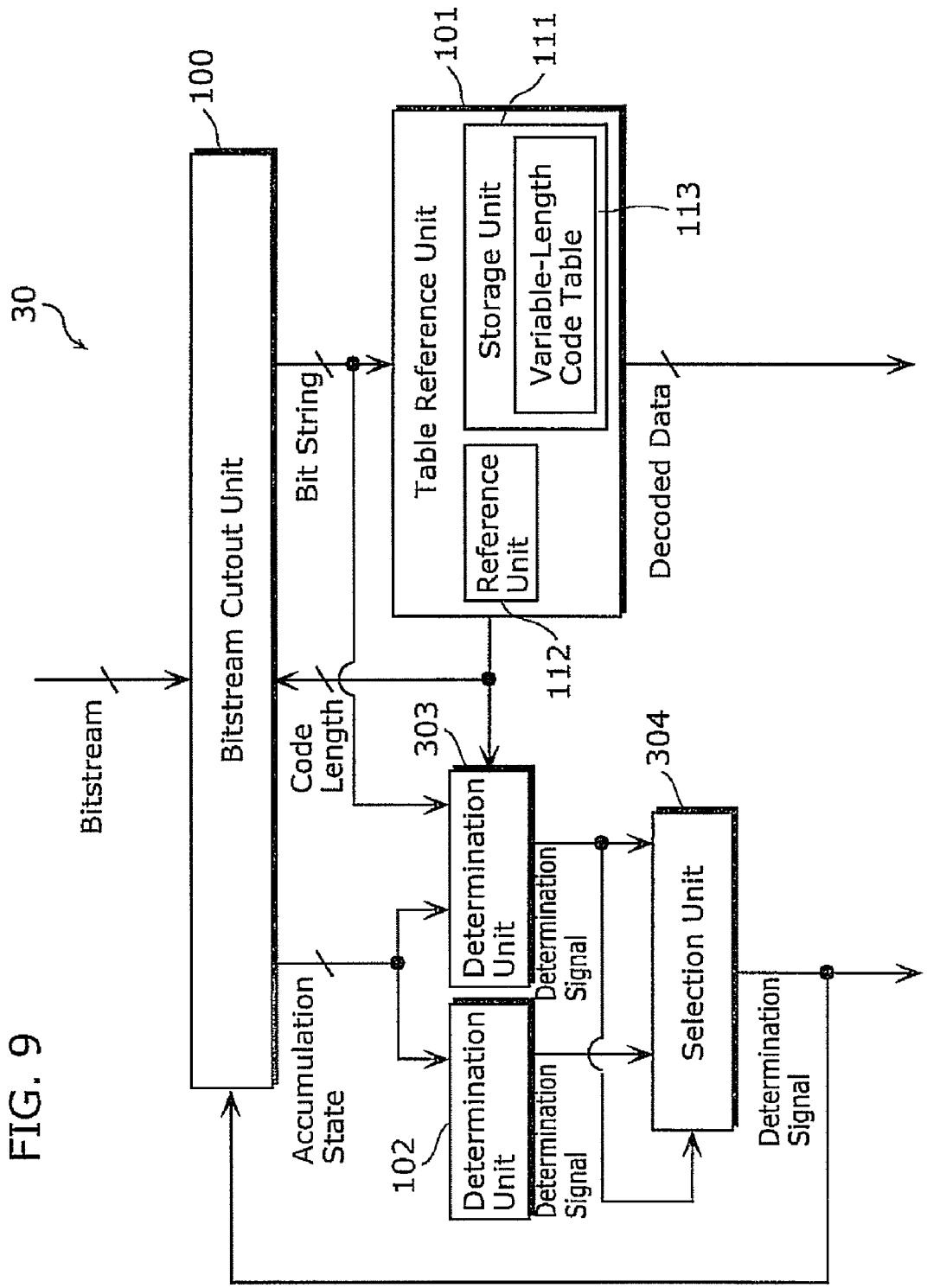
FIG. 9 is a block diagram illustrating the configuration of a variable-length code decoding apparatus according to a third embodiment.

FIG. 9 is a block diagram illustrating the configuration of a variable-length code decoding apparatus 30 according to the present embodiment. Note that identical reference numerals are assigned to the same constituent elements as those shown in FIG. 1, and redundant descriptions thereof will be omitted.

The variable-length code decoding apparatus 30 illustrated in FIG. 9 decodes a bitstream containing codewords that are variable-length encoded data and outputs the decoded data. The variable-length code decoding apparatus 30 includes a bitstream cutout unit 100, a table reference unit 101, determination units 102 and 303, and a selection unit 304. The variable-length code decoding apparatus 30 differs from the variable-length code decoding apparatus 10 of the first embodiment in that the determination method control unit 105 has been removed, the determination unit 103 has been replaced with the determination unit 303, and the selection unit 104 has been replaced with the selection unit 304. Note that in the present embodiment, a codeword "10" is assumed to be a codeword that indicates the end of the bitstream.

The determination unit 303 determines whether or not a codeword indicating the end of the bitstream is contained within a bit string outputted by the bitstream cutout unit 100, and whether or not an undecoded bitstream of at least the length from the starting bit of the undecoded bitstream to the end of the codeword is accumulated in the bitstream cutout unit 100.

To be more specific, in the case where the codeword "10" is decoded by sequentially decoding the bit string outputted by the bitstream cutout unit 100 and an accumulation state outputted by the bitstream cutout unit 100 is greater than or equal to the length from the starting bit of the bit string to the end of the decoded codeword "10", the determination unit 303 outputs a determination signal of "1". On the other hand, in the case where the codeword "10" is decoded by sequentially decoding the bit string outputted by the bitstream cutout unit 100 and the accumulation state outputted by the bitstream cutout unit 100 is less than the length from the starting bit of the bit string to the end of the decoded codeword "10", the determination unit 303 outputs a determination signal of "0". Furthermore, in the case where the codeword "10" is not decoded by sequentially decoding the bit string outputted by the bitstream cutout unit 100, the determination unit 303 outputs a determination signal of "0".

The selection unit 304 selects either the determination signal outputted by the determination unit 103 or the determination signal outputted by the determination unit 303 in accordance with the determination signal outputted by the determination unit 303. To be more specific, in the case where the determination signal outputted by the determination unit 303 is "0", the selection unit 304 selects the determination signal outputted by the determination unit 103. On the other hand, in the case where the determination signal outputted by the determination unit 303 is "1", the selection unit 304 selects the determination signal outputted by the determination unit 303.

In the case where the determination signal selected by the selection unit 304 is "1", the bitstream cutout unit 100 determines that the code length outputted by the reference unit 112 is valid, determines a new starting bit of the undecoded bitstream based on that code length, and cuts out and outputs a bit string. To be more specific, the bitstream cutout unit 100 sets, as the new starting bit, the bit that is located one bit further than the code length from the starting bit of the undecoded bitstream accumulated in the buffer 121. In other words, the bitstream that comes before the new starting bit is a decoded bitstream, whereas the bitstream that follows the new starting bit is a new, undecoded bitstream. On the other hand, in the case where the determination signal selected by the selection unit 304 is "0", the bitstream cutout unit 100 determines that the code length outputted by the reference unit 112 is invalid, and thus does not determine a new starting bit of the undecoded bitstream based on that code length.

As described thus far, in the case where a codeword indicating the end of the bitstream is contained within a bit string outputted by the bitstream cutout unit 100, and the length of the undecoded bitstream accumulated in the bitstream cutout unit 100 is greater than or equal to the length from the starting bit of the undecoded bitstream to that codeword, the determination unit 303 determines that the code length and the decoded data outputted by the table reference unit 101 is valid (that is, outputs a determination signal of "1"). In the case where the determination unit 303 has determined that the code length and the decoded data are valid, the selection unit 304 selects the determination result of the determination unit 303.

Accordingly, as in the second embodiment, by switching from the determination unit 102 to the determination unit 303 in the case where the end of the bitstream has been detected, decoding can be commenced at the point in time in which an undecoded bitstream greater than or equal to the maximum code length has been accumulated, and the decoding can be completed even in the case where the code length of the codeword at the end of the bitstream is less than the maximum code length.

Next, operations performed by the variable-length code decoding apparatus 30 according to the present embodiment will be described.

FIG. 10 is a diagram illustrating specific operations performed by the variable-length code decoding apparatus 30. Hereinafter, an operation whereby the variable-length code decoding apparatus 30 decodes a bitstream of "11111110111010" will be described. Here, as an example, it is assumed that a bitstream is inputted into the bitstream cutout unit 100 four bits at a time. Note that the underlined numbers (determination signals) shown in the columns of the determination units 102 and 303 in FIG. 10 are numbers (determination signals) selected by the selection unit 304.

<First Cycle>

In a first cycle, the first through fourth bits of the bitstream "11111110111010", or "1111", are inputted into the variable-length code decoding apparatus 30.

The bitstream cutout unit 100 accumulates the inputted bitstream "1111" and outputs an accumulation state of "4". Meanwhile, because the length of the undecoded bitstream accumulated in the bitstream cutout unit 100 is less than eight bits, the bitstream cutout unit 100 adds zeroes equivalent to the insufficient amount at the end of the bit string, and thus outputs a bit string of "11110000".

Because the first through fifth bits of the bit string "11110000" outputted by the bitstream cutout unit 100, or "11110", match the codeword "11110" stored in the storage unit 111, the table reference unit 101 outputs decoded data "e" and a code length of "5".

Because the accumulation state of "4" outputted by the bitstream cutout unit 100 is less than "8", the determination unit 102 outputs a determination signal of "0".

Furthermore, because the codeword "10" is not decoded by sequentially decoding the bit string "11110000" outputted by the bitstream cutout unit 100, the determination unit 303 outputs a determination signal of "0".

Meanwhile, because the determination signal outputted by the determination unit 303 is "0", the selection unit 304 selects the determination signal "0" outputted by the determination unit 102.

Finally, because the determination signal selected by the selection unit 304 is "0", the bitstream cutout unit 100 determines that the code length of "5" outputted by the table reference unit 101 is invalid, and thus does not determine a new starting bit of the undecoded bitstream based on that code length.

<Second Cycle>

In a second cycle, the fifth through eighth bits of the bitstream "11111110111010", or "1110", are inputted into the variable-length code decoding apparatus 30.

The bitstream cutout unit 100 accumulates the inputted bitstream "1110" and outputs an accumulation state of "8". Meanwhile, because the length of the undecoded bitstream accumulated in the bitstream cutout unit 100 is greater than or equal to eight bits, the bitstream cutout unit 100 cuts out eight bits' worth of a bit string from the starting bit of the bitstream, and outputs a bit string "11111110".

Because the bit string "11111110" outputted by the bitstream cutout unit 100 matches the codeword "11111110" stored in the storage unit 111, the table reference unit 101 outputs decoded data "h" and a code length of "8".

Because the accumulation state of "8" outputted by the bitstream cutout unit 100 is greater than or equal to "8", the determination unit 102 outputs a determination signal of "1".

Furthermore, because the codeword "10" is not decoded by sequentially decoding the bit string "11111110" outputted by the bitstream cutout unit 100, the determination unit 303 outputs a determination signal of "0".

Meanwhile, because the determination signal outputted by the determination unit 303 is "0", the selection unit 304 selects the determination signal "1" outputted by the determination unit 102.

Finally, because the determination signal selected by the selection unit 304 is "1", the bitstream cutout unit 100 determines that the code length of "8" outputted by the table reference unit 101 is valid, determines a new starting bit of the undecoded bitstream based on that code length, and cuts out and outputs the bit string to be decoded in the next cycle.

Here, the bitstream cutout unit 100 sets the bit following the "11111110" as the new starting bit.

<Third Cycle>

In a third cycle, the ninth through twelfth bits of the bitstream "11111110111010", or "1110", are inputted into the variable-length code decoding apparatus 30.

The bitstream cutout unit 100 accumulates the inputted bitstream "1110" and outputs an accumulation state of "4". Meanwhile, because the length of the undecoded bitstream accumulated in the bitstream cutout unit 100 is less than eight bits, the bitstream cutout unit 100 adds zeroes equivalent to the insufficient amount at the end of the bit string, and thus outputs a bit string of "11100000".

Because the first through fourth bits of the bit string "11100000" outputted by the bitstream cutout unit 100, or "1110", match the codeword "1110" stored in the storage unit 111, the table reference unit 101 outputs decoded data "d" and a code length of "4".

Because the accumulation state of "4" outputted by the bitstream cutout unit 100 is less than "8", the determination unit 102 outputs a determination signal of "0".

Furthermore, because the codeword "10" is not decoded by sequentially decoding the bit string "11100000" outputted by the bitstream cutout unit 100, the determination unit 303 outputs a determination signal of "0".

Meanwhile, because the determination signal outputted by the determination unit 303 is "0", the selection unit 304 selects the determination signal "0" outputted by the determination unit 102.

Finally, because the determination signal selected by the selection unit 304 is "0", the bitstream cutout unit 100 determines that the code length of "4" outputted by the table reference unit 101 is invalid, and thus does not determine a new starting bit of the undecoded bitstream based on that code length.

<Fourth Cycle>

In a fourth cycle, the thirteenth and fourteenth bits of the bitstream "11111110111010", or "10", are inputted into the variable-length code decoding apparatus 30.

The bitstream cutout unit 100 accumulates the inputted bitstream "10" and outputs an accumulation state of "6". Meanwhile, because the length of the undecoded bitstream accumulated in the bitstream cutout unit 100 is less than eight bits, the bitstream cutout unit 100 adds zeroes equivalent to the insufficient amount at the end of the bit string, and thus outputs a bit string of "11101000".

Because the first through fourth bits of the bit string "11101000" outputted by the bitstream cutout unit 100, or "1110", match the codeword "1110" stored in the storage unit 111, the table reference unit 101 outputs decoded data "d" and a code length of "4".

Because the accumulation state of "6" outputted by the bitstream cutout unit 100 is less than "8", the determination unit 102 outputs a determination signal of "0".

Because the codeword "10" is decoded by sequentially decoding the bit string "11101000" outputted by the bitstream cutout unit 100 and the accumulation state "6" outputted by the bitstream cutout unit 100 is greater than or equal to the length of "6" from the starting bit of the bit string to the end of the decoded codeword "10", the determination unit 303 outputs a determination signal of "1".

Meanwhile, because the determination signal outputted by the determination unit 303 is "1", the selection unit 304 selects the determination signal "1" outputted by the determination unit 303.

Finally, because the determination signal selected by the selection unit 304 is "1", the bitstream cutout unit 100 determines that the code length of "4" outputted by the table reference unit 101 is valid, determines a new starting bit of the undecoded bitstream based on that code length, and cuts out and outputs the bit string to be decoded in the next cycle. Here, the bitstream cutout unit 100 sets the bit following the "1110", or "1", as the new starting bit.

<Fifth Cycle>

In a fifth cycle, a bitstream is not inputted into the variable-length code decoding apparatus 30.

Because a bitstream is not inputted, the bitstream cutout unit 100 does not accumulate a bitstream, and thus outputs an accumulation state of "2". Meanwhile, because the length of the undecoded bitstream accumulated in the bitstream cutout unit 100 is less than eight bits, the bitstream cutout unit 100 adds zeroes equivalent to the insufficient amount at the end of the bit string, and thus outputs a bit string of "10000000".

Because the first and second bits of the bit string "10000000" outputted by the bitstream cutout unit 100, or "10", match the codeword "10" stored in the storage unit 111, the table reference unit 101 outputs decoded data "b" and a code length of "2".

Because the accumulation state of "2" outputted by the bitstream cutout unit 100 is less than "8", the determination unit 102 outputs a determination signal of "0".

Because the codeword "10" is decoded by sequentially decoding the bit string "10000000" outputted by the bitstream cutout unit 100 and the accumulation state "2" outputted by the bitstream cutout unit 100 is greater than or equal to the length "2" from the starting bit of the bit string to the end of the decoded codeword "10", the determination unit 303 outputs a determination signal of "1".

Meanwhile, because the determination signal outputted by the determination unit 303 is "1", the selection unit 304 selects the determination signal "1" outputted by the determination unit 303.

Finally, because the determination signal selected by the selection unit 304 is "1", the bitstream cutout unit 100 determines that the code length of "2" outputted by the table reference unit 101 is valid, determines a new starting bit of the undecoded bitstream based on that code length, and cuts out and outputs the bit string to be decoded in the next cycle.

As described thus far, if the codeword "10" indicating the end of the bitstream is contained within a bit string outputted by the bitstream cutout unit 100, and an undecoded bitstream of at least the length from the starting bit of the undecoded bitstream to the end of that codeword is accumulated in the bitstream cutout unit 100, the variable-length code decoding apparatus 30 of the present embodiment can decode the bitstream even if an undecoded bitstream greater than or equal to eight bits is not accumulated. Accordingly, decoding can be commenced at the point in time in which an undecoded bitstream greater than or equal to eight bits has been accumulated, and the decoding can be completed even in the case where the code length of the codeword at the end of the bitstream is less than eight bits.

Fourth Embodiment

First, the configuration of a variable-length code decoding apparatus according to the present embodiment will be described.

Figure 11:
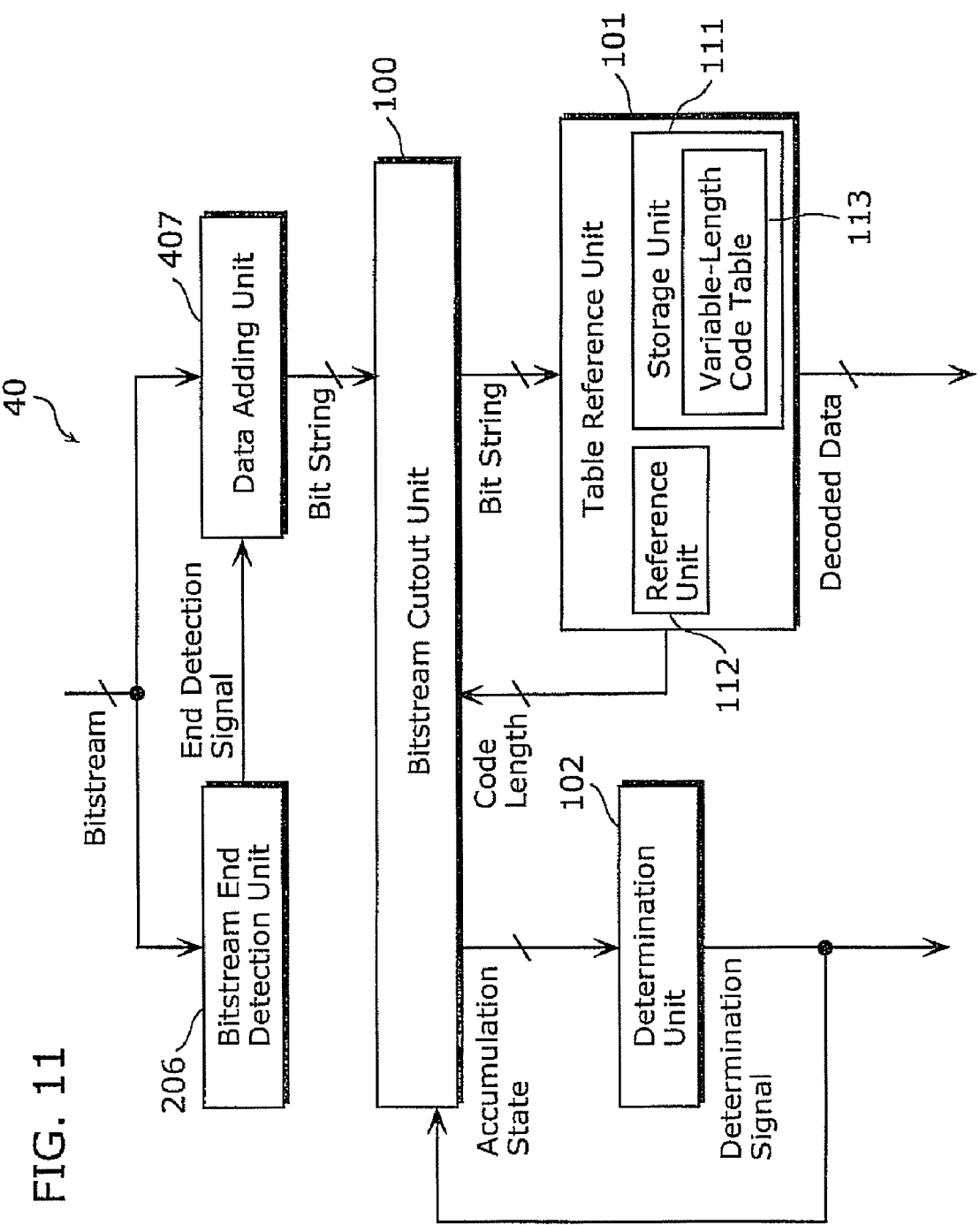
FIG. 11 is a block diagram illustrating the configuration of a variable-length code decoding apparatus according to a fourth embodiment.

FIG. 11 is a block diagram illustrating the configuration of the variable-length code decoding apparatus according to the present embodiment. Note that identical reference numerals are assigned to the same constituent elements as those shown in FIG. 1, and redundant descriptions thereof will be omitted.

A variable-length code decoding apparatus 40 illustrated in FIG. 11 decodes a bitstream containing codewords that are variable-length encoded data and outputs the decoded data. The variable-length code decoding apparatus 40 includes a bitstream cutout unit 100, a table reference unit 101, a determination unit 102, a bitstream end detection unit 206, and a data adding unit 407. The variable-length code decoding apparatus 40 differs from the variable-length code decoding apparatus 10 of the first embodiment in that the determination unit 103, the selection unit 104, and the determination method control unit 105 have been removed, and the bitstream end detection unit 206 and the data adding unit 407 have been added.

The bitstream end detection unit 206 is the same as the bitstream end detection unit 206 described in the second embodiment.

In the case where the end of the bitstream has been detected by the bitstream end detection unit 206, the data adding unit 407 adds data to the end of the bitstream. To be more specific, in the case where an end detection signal of "1" has been outputted by the bitstream end detection unit 206, the data adding unit 407 adds seven bits of zeroes to the end of the inputted bitstream and outputs that bitstream. On the other hand, in the case where an end detection signal of "0" has been outputted by the bitstream end detection unit 206, the data adding unit 407 outputs the inputted bitstream as-is. In the case where a bitstream is not inputted, the data adding unit 407 does nothing.

As described thus far, the variable-length code decoding apparatus 40 of the present embodiment includes only one determination unit (the determination unit 102), unlike the first through third embodiments. As described earlier, the determination unit 102 determines whether or not the code length of a bitstream accumulated in the bitstream cutout unit 100 is greater than or equal to the maximum code length. In other words, even in the case where the code length of the bitstream accumulated in the bitstream cutout unit 100 is less than the maximum code length, the data adding unit 407 adds data to the end of the bitstream when the end has been detected in order to decode the bitstream.

Accordingly, in the case where the codeword at the end of the bitstream is accumulated, the length of the accumulated undecoded bitstream can always be set to greater than or equal to the maximum code length. As a result, decoding can be commenced at the point in time in which an undecoded bitstream greater than or equal to the maximum code length has been accumulated, and the decoding can be completed even in the case where the code length of the codeword at the end of the bitstream is less than the maximum code length.

Next, operations performed by the variable-length code decoding apparatus 40 according to the present embodiment will be described.

FIG. 12 is a diagram illustrating specific operations performed by the variable-length code decoding apparatus 40. Hereinafter, an operation whereby the variable-length code decoding apparatus 40 decodes a bitstream of "11111110111010" will be described. Here, as an example, the bitstream is inputted into the bitstream end detection unit 206 and the data adding unit 407 four bits at a time.

<First Cycle>

In a first cycle, the first through fourth bits of the bitstream "11111110111010", or "1111", are inputted into the variable-length code decoding apparatus 40.

Because the bitstream end detection unit 206 has not detected the end of the bitstream, the bitstream end detection unit 206 outputs an end detection signal of "0".

Meanwhile, because an end detection signal of "0" has been outputted by the bitstream end detection unit 206, the data adding unit 407 outputs the inputted bitstream "1111" as-is.

The bitstream cutout unit 100 accumulates the bitstream "1111" outputted by the data adding unit 407 and outputs an accumulation state of "4". Meanwhile, because the length of the undecoded bitstream accumulated in the bitstream cutout unit 100 is less than eight bits, the bitstream cutout unit 100 adds zeroes equivalent to the insufficient amount at the end of the bit string, and thus outputs a bit string of "11110000".

Because the first through fifth bits of the bit string "11110000" outputted by the bitstream cutout unit 100, or "11110", match the codeword "11110" stored in the storage unit 111, the table reference unit 101 outputs decoded data "e" and a code length of "5".

Because the accumulation state of "4" outputted by the bitstream cutout unit 100 is less than "8", the determination unit 102 outputs a determination signal of "0".

Finally, because the determination signal outputted by the determination unit 102 is "0", the bitstream cutout unit 100 determines that the code length of "5" outputted by the table reference unit 101 is invalid, and thus does not determine a new starting bit of the undecoded bitstream based on that code length.

<Second Cycle>

In a second cycle, the fifth through eighth bits of the bitstream "11111110111010", or "1110", are inputted into the variable-length code decoding apparatus 40.

Because the bitstream end detection unit 206 has not detected the end of the bitstream, the bitstream end detection unit 206 outputs an end detection signal of "0".

Meanwhile, because an end detection signal of "0" has been outputted by the bitstream end detection unit 206, the data adding unit 407 outputs the inputted bitstream "1110" as-is.

The bitstream cutout unit 100 accumulates the bitstream "1110" outputted by the data adding unit 407 and outputs an accumulation state of "8". Meanwhile, because the length of the undecoded bitstream accumulated in the bitstream cutout unit 100 is greater than or equal to eight bits, the bitstream cutout unit 100 cuts out eight bits' worth of a bit string from the starting bit of the bitstream, and outputs a bit string "11111110".

Because the bit string "11111110" outputted by the bitstream cutout unit 100 matches the codeword "11111110" stored in the storage unit 111, the table reference unit 101 outputs decoded data "h" and a code length of "8".

Because the accumulation state of "8" outputted by the bitstream cutout unit 100 is greater than or equal to "8", the determination unit 102 outputs a determination signal of "1".

Finally, because the determination signal outputted by the determination unit 102 is "1", the bitstream cutout unit 100 determines that the code length of "8" outputted by the table reference unit 101 is valid, determines a new starting bit of the undecoded bitstream based on that code length, and cuts out and outputs the bit string to be decoded in the next cycle. Here, the bitstream cutout unit 100 sets the bit following the "11111110" as the new starting bit.

<Third Cycle>

In a third cycle, the ninth through twelfth bits of the bitstream "11111110111010", or "1110", are inputted into the variable-length code decoding apparatus 40.

Because the bitstream end detection unit 206 has not detected the end of the bitstream, the bitstream end detection unit 206 outputs an end detection signal of "0".

Meanwhile, because an end detection signal of "0" has been outputted by the bitstream end detection unit 206, the data adding unit 407 outputs the inputted bitstream "1110" as-is.

The bitstream cutout unit 100 accumulates the bitstream "1110" outputted by the data adding unit 407 and outputs an accumulation state of "4". Meanwhile, because the length of the undecoded bitstream accumulated in the bitstream cutout unit 100 is less than eight bits, the bitstream cutout unit 100 adds zeroes equivalent to the insufficient amount at the end of the bit string, and thus outputs a bit string of "11100000".

Because the first through fourth bits of the bit string "11100000" outputted by the bitstream cutout unit 100, or "1110", match the codeword "1110" stored in the storage unit 111, the table reference unit 101 outputs decoded data "d" and a code length of "4".

Because the accumulation state of "4" outputted by the bitstream cutout unit 100 is less than "8", the determination unit 102 outputs a determination signal of "0".

Finally, because the determination signal outputted by the determination unit 102 is "0", the bitstream cutout unit 100 determines that the code length of "4" outputted by the table reference unit 101 is invalid, and thus does not determine a new starting bit of the undecoded bitstream based on that code length.

<Fourth Cycle>

In a fourth cycle, the thirteenth and fourteenth bits of the bitstream "11111110111010", or "10", are inputted into the variable-length code decoding apparatus 40.

Because the bitstream end detection unit 206 has detected the end of the bitstream, the bitstream end detection unit 206 outputs an end detection signal of "1".

Meanwhile, because an end detection signal of "1" has been outputted by the bitstream end detection unit 206, the data adding unit 407 adds seven bits of zeroes to the end of the inputted bitstream "10" and outputs a bitstream of "100000000".

The bitstream cutout unit 100 accumulates the bitstream "100000000" outputted by the data adding unit 407 and outputs an accumulation state of "13". Meanwhile, because the length of the undecoded bitstream accumulated in the bitstream cutout unit 100 is greater than or equal to eight bits, the bitstream cutout unit 100 cuts out eight bits' worth of a bit string from the starting bit of the bitstream, and outputs a bit string "11101000".

Because the first through fourth bits of the bit string "11101000" outputted by the bitstream cutout unit 100, or "1110", match the codeword "1110" stored in the storage unit 111, the table reference unit 101 outputs decoded data "d" and a code length of "4".

Because the accumulation state of "13" outputted by the bitstream cutout unit 100 is greater than or equal to "8", the determination unit 102 outputs a determination signal of "1".

Finally, because the determination signal outputted by the determination unit 102 is "1", the bitstream cutout unit 100 determines that the code length of "4" outputted by the table reference unit 101 is valid, determines a new starting bit of the undecoded bitstream based on that code length, and cuts out and outputs the bit string to be decoded in the next cycle. Here, the bitstream cutout unit 100 sets the bit following the "1110", or "1", as the new starting bit.

<Fifth Cycle>

In a fifth cycle, a bitstream is not inputted into the variable-length code decoding apparatus 40.

Because the bitstream end detection unit 206 detected the end of the bitstream in the fourth cycle, the bitstream end detection unit 206 outputs an end detection signal of "1".

Because a bitstream is not inputted, the data adding unit 407 does nothing.

Furthermore, because a bitstream is not outputted by the data adding unit 407, the bitstream cutout unit 100 does not accumulate a bitstream, and thus outputs an accumulation state of "9". Meanwhile, is because the length of the undecoded bitstream accumulated in the bitstream cutout unit 100 is greater than or equal to eight bits, the bitstream cutout unit 100 cuts out eight bits' worth of a bit string from the starting bit of the bitstream, and outputs a bit string "10000000".

Because the first and second bits of the bit string "10000000" outputted by the bitstream cutout unit 100, or "10", match the codeword "10" stored in the storage unit 111, the table reference unit 101 outputs decoded data "b" and a code length of "2".

Because the accumulation state of "9" outputted by the bitstream cutout unit 100 is greater than or equal to "8", the determination unit 102 outputs a determination signal of "1".

Finally, because the determination signal outputted by the determination unit 102 is "1", the bitstream cutout unit 100 determines that the code length of "2" outputted by the table reference unit 101 is valid, determines a new starting bit of the undecoded bitstream based on that code length, and cuts out and outputs the bit string to be decoded in the next cycle.

As described thus far, in the case where the codeword at the end of the bitstream is accumulated in the bitstream cutout unit 100, seven bits of zeroes are added by the data adding unit 407 to the end of the bitstream, and thus the variable-length code decoding apparatus 40 of the present embodiment can accumulate an undecoded bitstream that is greater than or equal to eight bits. Accordingly, decoding can be commenced at the point in time in which an undecoded bitstream greater than or equal to eight bits has been accumulated, and the decoding can be completed even in the case where the code length of the codeword at the end of the bitstream is less than eight bits.

Although the foregoing describes the data adding unit 407 as adding seven bits of zeroes to the inputted bitstream in the case where an end detection signal of "1" has been outputted by the bitstream end detection unit 206, it should be noted that any given data aside from zeroes may be added instead.

In addition, the length of the bit string outputted by the bitstream cutout unit 100 may be a predetermined fixed length. In other words, the bitstream cutout unit 100 may output a bit string of a fixed length following the starting bit of the undecoded bitstream accumulated in the bitstream cutout unit 100. At this time, the determination unit 102 determines whether or not an undecoded bitstream of at least the fixed length is accumulated in the bitstream cutout unit 100. Furthermore, the data adding unit 407 adds data of a length at least one bit shorter than the fixed length to the end of the bitstream.

Fifth Embodiment

First, the configuration of a variable-length code decoding apparatus according to the present embodiment will be described.

Figure 13:
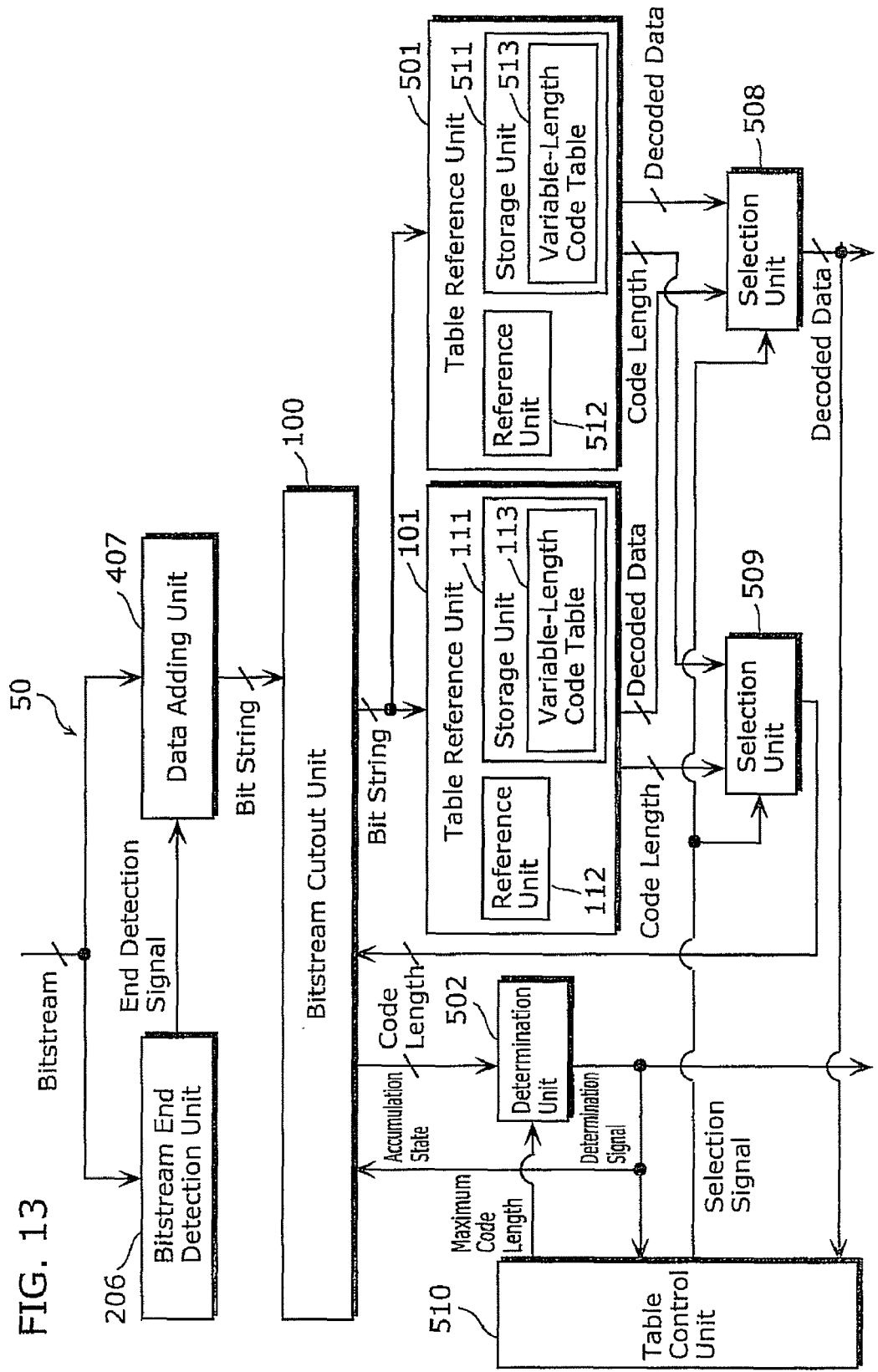
FIG. 13 is a block diagram illustrating the configuration of a variable-length code decoding apparatus according to a fifth embodiment.
Figure 16:
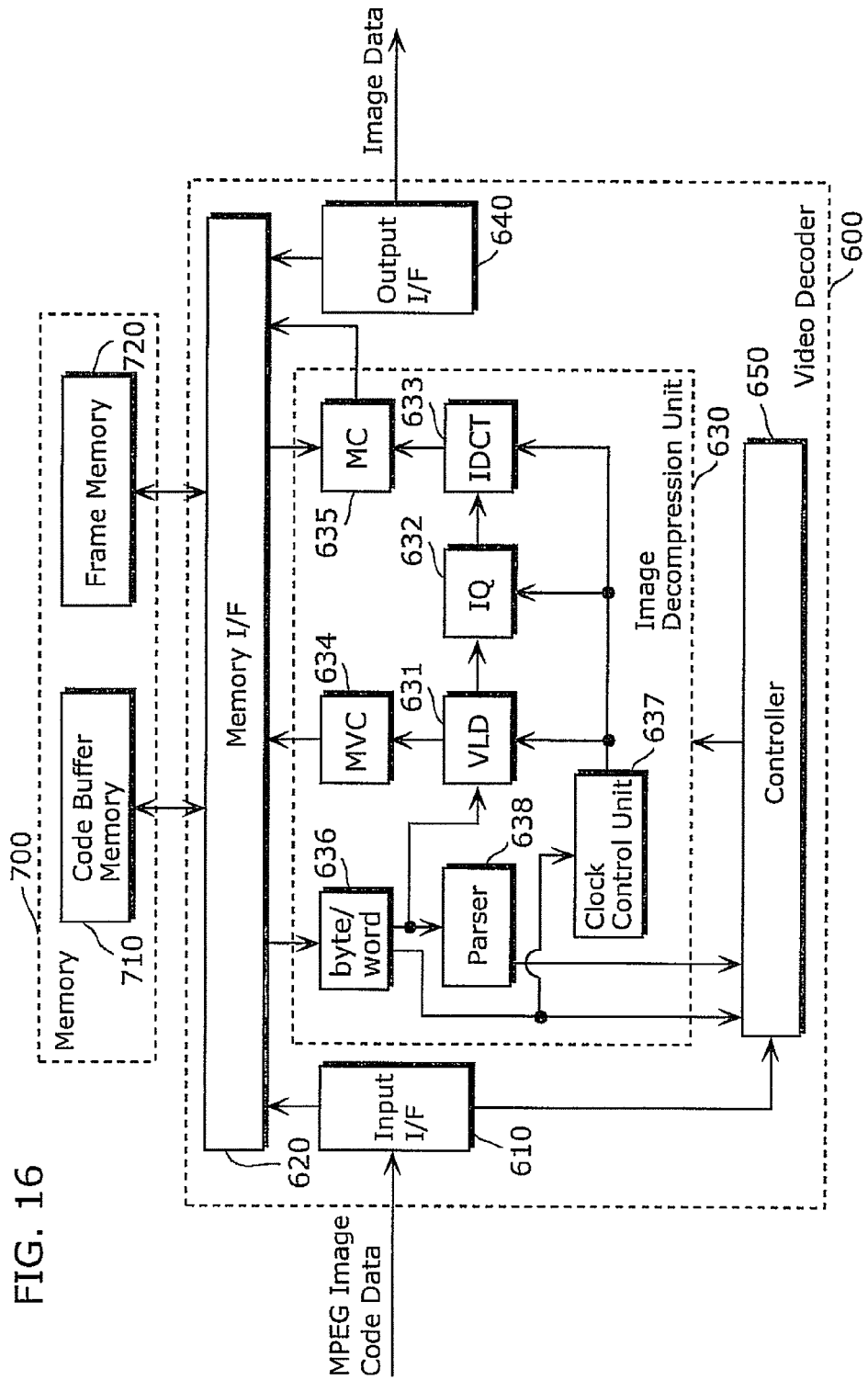
FIG. 16 is a block diagram illustrating the configuration of a conventional variable-length code decoding apparatus.

FIG. 13 is a block diagram illustrating the configuration of a variable-length code decoding apparatus 50 according to the present embodiment. Note that identical reference numerals are assigned to the same constituent elements as those shown in FIG. 11, and redundant descriptions thereof will be omitted.

The variable-length code decoding apparatus 50 illustrated in FIG. 13 decodes a bitstream containing codewords that are variable-length encoded data and outputs the decoded data.

The variable-length code decoding apparatus 50 includes a bitstream end detection unit 206, a data adding unit 407, a bitstream cutout unit 100, table reference units 101 and 501, a determination unit 502, selection units 508 and 509, and a table control unit 510. The variable-length code decoding apparatus 50 differs from the variable-length code decoding apparatus 40 of the fourth embodiment in that the determination unit 102 has been replaced with the determination unit 502 and the table reference unit 501, the selection units 508 and 509, and the table control unit 510 have been added.

The determination unit 502 determines whether or not an undecoded bitstream of at least the maximum code length outputted by the table control unit 510 is accumulated in the bitstream cutout unit 100. To be more specific, in the case where an accumulation state outputted by the bitstream cutout unit 100 is greater than or equal to the maximum code length outputted by the table control unit 510, the determination unit 502 outputs a determination signal of "1". On the other hand, in the case where the accumulation state outputted by the bitstream cutout unit 100 is less than the maximum code length outputted by the table control unit 510, the determination unit 502 outputs a determination signal of "0".

The table reference unit 501 includes a storage unit 511 and a reference unit 512. The storage unit 511 is a memory that stores a variable-length code table 513 of a different type than the storage unit 111. FIG. 14 is a diagram illustrating an example of the variable-length code table 513 stored in the storage unit 511. Note that the variable-length code table 513 stored in the storage unit 511 is a variable-length code table whose maximum code length is four bits.

The selection unit 508 selects either decoded data outputted by the table reference unit 101 or decoded data outputted by the table reference unit 501 in accordance with a selection signal outputted by the table control unit 510. To be more specific, in the case where a selection signal of "0" has been outputted by the table control unit 510, the selection unit 508 selects the decoded data outputted by the table reference unit 101. On the other hand, in the case where a selection signal of "1" has been outputted by the table control unit 510, the selection unit 508 selects the decoded data outputted by the table reference unit 501.

The selection unit 509 selects either a code length outputted by the table reference unit 101 or a code length outputted by the table reference unit 501 in accordance with a selection signal outputted by the table control unit 510. To be more specific, in the case where a selection signal of "0" has been outputted by the table control unit 510, the selection unit 509 selects the code length outputted by the table reference unit 101. On the other hand, in the case where a selection signal of "1" has been outputted by the table control unit 510, the selection unit 509 selects the code length outputted by the table reference unit 501.

The table control unit 510 outputs a selection signal for selecting either the decoded data and code length outputted by the table reference unit 101 or the decoded data and code length outputted by the table reference unit 501. To be more specific, in the case where the table control unit 510 outputs a selection signal of "0" and a determination signal of "1" has been outputted by the determination unit 502, the table control unit 510 outputs a selection signal of "1" in the next cycle. On the other hand, in the case where the table control unit 510 outputs a selection signal of "1" and a determination signal of "1" has been outputted by the determination unit 502, the table control unit 510 outputs a selection signal of "0" in the next cycle. Furthermore, in the case where a determination signal of "0" has been outputted by the determination unit 502, the table control unit 510 does not update the selection signal in the next cycle. Note that the selection signal of "0" is outputted in an initial state.

Furthermore, in accordance with the outputted selection signal, the table control unit 510 outputs either the codeword and maximum code length contained in the variable-length code table 113 stored by the storage unit 111 or the codeword and maximum code length contained in the variable-length code table 513 stored in the storage unit 511. To be more specific, in the case where a selection signal of "0" is outputted, the table control unit 510 outputs a maximum code length of "8". On the other hand, in the case where a selection signal of "1" is outputted, the table control unit 510 outputs a maximum code length of "4". Note that in the initial state, the selection signal of "0" is outputted, and thus a maximum code length of "8" is outputted.

In the case where the determination signal outputted by the determination unit 502 is "1", the bitstream cutout unit 100 determines that the code length selected by the selection unit 509 is valid, determines a new starting bit of the undecoded bitstream based on that code length, and cuts out and outputs a bit string. To be more specific, the bitstream cutout unit 100 sets, as the new starting bit, the bit that is located one bit further than the code length from the starting bit of the undecoded bitstream accumulated in the buffer 121. In other words, the bitstream that comes before the new starting bit is a decoded bitstream, whereas the bitstream that follows the new starting bit is a new, undecoded bitstream.

On the other hand, in the case where the determination signal outputted by the determination unit 502 is "0", the bitstream cutout unit 100 determines that the code length selected by the selection unit 509 is invalid, and thus does not determine a new starting bit of the undecoded bitstream based on that code length.

Accordingly, by switching a threshold used by the determination unit 502 as appropriate, a codeword contained in the variable-length code table stored in one of the multiple storage units that has a shorter maximum code length can be decoded at a high speed.

Next, operations performed by the variable-length code decoding apparatus 50 according to the present embodiment will be described.

FIG. 15 is a diagram illustrating specific operations performed by the variable-length code decoding apparatus 50. Hereinafter, an operation whereby the variable-length code decoding apparatus 50 decodes a bitstream of "11111110000111111110 . . . " will be described. Here, as an example, the bitstream is inputted into the bitstream end detection unit 206 and the data adding unit 407 four bits at a time. Note that the underlined letters (decoded data) and numbers (code lengths) shown in the columns of the table reference units 101 and 501 in FIG. 15 are letters (decoded data) and numbers (code lengths) respectively selected by the selection units 508 and 509.

<First Cycle>

In the first cycle, the first through fourth bits of the bitstream "11111110000111111110 . . . ", or "1111", are inputted into the variable-length code decoding apparatus 50.

Because the bitstream end detection unit 206 has not detected the end of the bitstream, the bitstream end detection unit 206 outputs an end detection signal of "0".

Meanwhile, because an end detection signal of "0" has been outputted by the bitstream end detection unit 206, the data adding unit 407 outputs the inputted bitstream "1111" as-is.

The bitstream cutout unit 100 accumulates the bitstream "1111" outputted by the data adding unit 407 and outputs an accumulation state of "4". Meanwhile, because the length of the undecoded bitstream accumulated in the bitstream cutout unit 100 is less than eight bits, the bitstream cutout unit 100 adds zeroes equivalent to the insufficient amount at the end of the bit string, and thus outputs a bit string of "11110000".

Because the accumulation state of "4" outputted by the bitstream cutout unit 100 is less than the maximum code length "8" outputted by the table control unit 510 (that is, the initial state), the determination unit 502 outputs a determination signal of "0".

Because the first through fifth bits of the bit string "11110000" outputted by the bitstream cutout unit 100, or "11110", match the codeword "11110" stored in the storage unit 111, the table reference unit 101 outputs decoded data "e" and a code length of "5".

Furthermore, because the first bit "1" of the bit string "11110000" outputted by the bitstream cutout unit 100 matches the codeword "1" stored in the storage unit 511, the table reference unit 501 outputs decoded data "i" and a code length of "1".

Because a selection signal of "0" has been outputted by the table control unit 510 (that is, it is the initial state), the selection units 508 and 509 select the decoded data "e" and the code length "5" outputted by the table reference unit 101.

Because a determination signal of "0" has been outputted by the determination unit 502, in the next cycle (a second cycle), the table control unit 510 outputs a selection signal of "0" and a maximum code length of "8", without updating the selection signal.

Finally, because the determination signal outputted by the determination unit 502 is "0", the bitstream cutout unit 100 determines that the code length of "5" selected by the selection unit 509 is invalid, and thus does not determine a new starting bit of the undecoded bitstream based on that code length.

<Second Cycle>

In the second cycle, the fifth through eighth bits of the bitstream "1111111000011111110 . . . ", or "1110", are inputted into the variable-length code decoding apparatus 50.

Because the bitstream end detection unit 206 has not detected the end of the bitstream, the bitstream end detection unit 206 outputs an end detection signal of "0".

Meanwhile, because an end detection signal of "0" has been outputted by the bitstream end detection unit 206, the data adding unit 407 outputs the inputted bitstream "1110" as-is.

The bitstream cutout unit 100 accumulates the bitstream "1110" outputted by the data adding unit 407 and outputs an accumulation state of "8". Meanwhile, because the length of the undecoded bitstream accumulated in the bitstream cutout unit 100 is greater than or equal to eight bits, the bitstream cutout unit 100 cuts out eight bits' worth of a bit string from the starting bit of the bitstream, and outputs a bit string "11111110".

Because the accumulation state of "8" outputted by the bitstream cutout unit 100 is greater than or equal to the maximum code length "8" outputted by the table control unit 510, the determination unit 502 outputs a determination signal of "1".

Because the bit string "11111110" outputted by the bitstream cutout unit 100 matches the codeword "11111110" stored in the storage unit 111, the table reference unit 101 outputs decoded data "h" and a code length of "8".

Furthermore, because the first bit "1" of the bit string "11111110" outputted by the bitstream cutout unit 100 matches the codeword "1" stored in the storage unit 511, the table reference unit 501 outputs decoded data "i" and a code length of "1".

Because a selection signal of "0" has been outputted by the table control unit 510, the selection units 508 and 509 select the decoded data "h" and the code length "8" outputted by the table reference unit 101.

Meanwhile, because a selection signal of "0" has been outputted and a determination signal of "1" has been outputted by the determination unit 502, in the next cycle (a third cycle), the table control unit 510 outputs a selection signal of "1" and a maximum code length of "4".

Finally, because the determination signal outputted by the determination unit 502 is "1", the bitstream cutout unit 100 determines that the code length of "8" selected by the selection unit 509 is valid, determines a new starting bit of the undecoded bitstream based on that code length, and cuts out and outputs the bit string to be decoded in the next cycle. Here, the bitstream cutout unit 100 sets the bit following the "11111110" as the new starting bit.

<Third Cycle>

In the third cycle, the ninth through twelfth bits of the bitstream "1111111000011111110 . . . ", or "0001", are inputted into the variable-length code decoding apparatus 50.

Because the bitstream end detection unit 206 has not detected the end of the bitstream, the bitstream end detection unit 206 outputs an end detection signal of "0".

Meanwhile, because an end detection signal of "0" has been outputted by the bitstream end detection unit 206, the data adding unit 407 outputs the inputted bitstream "0001" as-is.

The bitstream cutout unit 100 accumulates the bitstream "0001" outputted by the data adding unit 407 and outputs an accumulation state of "4". Meanwhile, because the length of the undecoded bitstream accumulated in the bitstream cutout unit 100 is less than eight bits, the bitstream cutout unit 100 adds zeroes equivalent to the insufficient amount at the end of the bit string, and thus outputs a bit string of "00010000".

Because the accumulation state of "4" outputted by the bitstream cutout unit 100 is greater than or equal to the maximum code length "4" outputted by the table control unit 510, the determination unit 502 outputs a determination signal of "1".

Furthermore, because the first bit "0" of the bit string "00010000" outputted by the bitstream cutout unit 100 matches the codeword "0" stored in the storage unit 111, the table reference unit 101 outputs decoded data "a" and a code length of "1".

Because the first through fourth bits of the bit string "00010000" outputted by the bitstream cutout unit 100, or "0001", match the codeword "0001" stored in the storage unit 511, the table reference unit 501 outputs decoded data "1" and a code length of "4".

Because a selection signal of "1" has been outputted by the table control unit 510, the selection units 508 and 509 select the decoded data "1" and the code length "4" outputted by the table reference unit 501.

Meanwhile, because a selection signal of "1" has been outputted and a determination signal of "1" has been outputted by the determination unit 502, in the next cycle (a fourth cycle), the table control unit 510 outputs a selection signal of "0" and a maximum code length of "8".

Finally, because the determination signal outputted by the determination unit 502 is "1", the bitstream cutout unit 100 determines that the code length of "4" selected by the selection unit 509 is valid, determines a new starting bit of the undecoded bitstream based on that code length, and cuts out and outputs the bit string to be decoded in the next cycle.

As described thus far, in the case where a codeword contained in the variable-length code table 513 that is stored in the storage unit 511 is to be decoded, and if an undecoded bitstream of at least four bits is accumulated in the bitstream cutout unit 100, the variable-length code decoding apparatus 50 of the present embodiment can execute the decoding even if an undecoded bitstream greater than or equal to eight bits is not accumulated. Accordingly, a codeword contained in the variable-length code table 513 whose maximum code length is less than eight bits can be decoded at a high speed.

Although the foregoing describes the storage unit 511 as storing a variable-length code table with a maximum code length of four bits, it should be noted that the storage unit 511 may store a variable-length code table with any given maximum code length aside from four bits.

In addition, although the foregoing describes the table control unit 510 as alternately selecting between the table reference units 101 and 501 each time a codeword is decoded, the selection may be carried out in any given order in accordance with the standard or the like.

In addition, although the foregoing describes the variable-length code decoding apparatus 50 as including two types of table reference units, or the table reference units 101 and 501, three or more types of table reference units may be provided.

In addition, the present embodiment may be applied in the variable-length code decoding apparatuses according to the aforementioned first through fourth embodiments. In other words, in the variable-length code decoding apparatuses according to the first through fourth embodiments, the determination unit 102 may be configured in the same manner as the determination unit 502, and the table reference unit 501, the selection units 508 and 509, and the table control unit 510 may be added.

Although embodiments of a variable-length code decoding apparatus and method thereof according to the present invention have been described thus far, the present invention is not intended to be limited to these embodiments. Various types of variations on the embodiments that can be conceived by one skilled in the art, implementations of the present invention created by combining constituent elements from different embodiments, and so on that do not depart from the essential spirit of the present invention also fall within the scope of the present invention.

For example, the present invention may be realized as a program that causes a computer to execute the steps contained in the variable-length code decoding method according to the present invention. The present invention may also be realized as a computer-readable recording medium such as a CD-ROM (Compact Disc-Read Only Memory) on which the stated program is recorded, or as information, data, or a signal that realizes the stated program. Furthermore, the program, information, data, and signal may be distributed via a communication network such as the Internet.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The present invention is applicable in variable-length code decoding apparatuses, and is particularly applicable as a decoding apparatus for moving pictures or audio realized as an electronic circuit such as an LSI circuit or the like. For example, the present invention is useful as a decoding apparatus for moving pictures or audio, included in a personal computer, a digital television, a DVD (Digital Versatile Disc) player, a DVD recorder, a PDA (Personal Digital Assistant), a cellular telephone, or the like that decodes and plays back encoded moving pictures or audio.

What is claimed is:

1. A variable-length code decoding apparatus that decodes a bitstream containing variable-length encoded data, said apparatus comprising:
   a first storage configured to store multiple codewords used in variable-length encoding as well as decoded data and code lengths respectively corresponding to the multiple codewords;
   a bit outputter that includes a buffer that accumulates the bitstream and that is configured to output a bit string of a first length starting from a starting bit of an undecoded bitstream accumulated in the buffer, and when a length of the undecoded bitstream accumulated in the buffer is less than the first length, output the bit string of the first length by adding data to an end of the bit string;
   a first referrer configured to output decoded data and a code length corresponding to a codeword that matches a codeword at a start of the bit string output by said bit outputter with reference to said first storage;
   a first determiner configured to determine whether or not at least the undecoded bitstream of the first length is accumulated in the buffer;
   a second determiner configured to determine whether or not at least the undecoded bitstream of a second length is accumulated in the buffer, the second length being shorter than the first length; and
   a selector configured to select a determination result from one of said first determiner and said second determiner,
   wherein said bit outputter is configured to, when the determination result selected by said selector indicates that at least the undecoded bitstream of the first length or the second length is accumulated in the buffer, set a new starting bit based on the code length output by said first referrer and output a new bit string of the first length in accordance with the set starting bit; and
   said selector is configured to switch the selection of the determination result between said first determiner and said second determiner based on the length of the undecoded bitstream accumulated in the buffer.

2. The variable-length code decoding apparatus according to claim 1,
   wherein said selector is configured to select the determination result from said second determiner when said selector has selected the determination result from said first determiner and the selected determination result does not indicate that at least the undecoded bitstream of the first length is accumulated in the buffer.

3. The variable-length code decoding apparatus according to claim 2,
   wherein said selector is further configured to select the determination result from said first determiner when said selector has selected the determination result from said second determiner and the selected determination result indicates that at least the undecoded bitstream of the second length is accumulated in the buffer.

4. The variable-length code decoding apparatus according to claim 1,
wherein said selector is configured to select the determination result from said first determiner and the determination result from said second determiner in an alternating manner.

5. The variable-length code decoding apparatus according to claim 1,
wherein the second length is the code length output by said first referrer.

6. The variable-length code decoding apparatus according to claim 1,
wherein the first length is a maximum length of the multiple code lengths stored in said first storage.

7. The variable-length code decoding apparatus according to claim 1,
wherein the second length is one bit, and
said variable-length code decoding apparatus further comprises
an end detector configured to detect an end of the bitstream,
wherein said selector is configured to select the determination result from said second determiner when the end has been detected by said end detector.

8. The variable-length code decoding apparatus according to claim 7,
wherein said end detector is configured to detect the end by detecting a codeword that indicates the end of the bitstream.

9. The variable-length code decoding apparatus according to claim 7,
wherein said end detector is configured to detect the end by analyzing header information contained in the bitstream.

10. The variable-length code decoding apparatus according to claim 1,
wherein said selector is configured to select the determination result from said second determiner when a codeword indicating an end of the bitstream is contained in the bit string of the first length output by said bit outputter.

11. The variable-length code decoding apparatus according to claim 1, further comprising:
a second storage configured to store multiple codewords used in the variable-length encoding that are different from the codewords stored in said first storage, as well as decoded data and code lengths respectively corresponding to the multiple codewords stored in the second storage;
a second referrer configured to output decoded data and a code length corresponding to a codeword that matches the codeword at the start of the bit string output by said bit outputter with reference to said second storage; and
a second selector configured to select one of said first referrer and said second referrer,
wherein the first length is a maximum length of the multiple code lengths stored in the first or second storage referred to by the referrer selected by said second selector.

12. A variable-length code decoding apparatus that decodes a bitstream containing variable-length encoded data, said apparatus comprising:
a first storage configured to store multiple codewords used in the variable-length encoding as well as decoded data and code lengths respectively corresponding to the multiple codewords;
an end detector configured to detect an end of the bitstream;
a data adder configured to add data to the end of the bitstream when the end has been detected by said end detector;
a bit outputter that includes a buffer that accumulates the bitstream and that is configured to output a bit string of a fixed length starting from a starting bit of the undecoded bitstream accumulated in the buffer, and when a length of the undecoded bitstream accumulated in the buffer is less than the fixed length, output the bit string of the fixed length by adding data to an end of the bit string;
a first referrer configured to output decoded data and a code length corresponding to a codeword that matches a codeword at a start of the bit string output by said bit outputter with reference to said first storage; and
a first determiner configured to determine whether or not at least the fixed length of the undecoded bitstream is accumulated in the buffer,
wherein said bit outputter is configured to, when the determination result of said first determiner indicates that at least the fixed length of the undecoded bitstream is accumulated in the buffer, set a new starting bit based on the code length output by said first referrer and output a new bit string of the fixed length in accordance with the set starting bit; and
said data adder is configured to add data of a length that is at least one bit shorter than the fixed length.

13. The variable-length code decoding apparatus according to claim 12,
wherein the fixed length is a maximum length of the multiple code lengths stored in said first storage.

14. The variable-length code decoding apparatus according to claim 12, further comprising:
a second storage configured to store multiple codewords used in the variable-length encoding that are different from the codewords stored in said first storage, as well as decoded data and code lengths respectively corresponding to the multiple codewords stored in the second storage;
a second referrer configured to output decoded data and a code length corresponding to a codeword that matches the codeword at the start of the bit string output by said bit outputter with reference to said second storage; and
a second selector configured to select one of said first referrer and said second referrer,
wherein the fixed length is a maximum length of the multiple code lengths stored in the first or second storage referred to by the referrer selected by said second selector.

15. A variable-length code decoding method of decoding a bitstream containing variable-length encoded data, the method comprising:
accumulating the bitstream in a buffer, outputting a bit string of a first length starting from a starting bit of an undecoded bitstream accumulated in the buffer, and when a length of the undecoded bitstream accumulated in the buffer is less than the first length, outputting the bit string of the first length by adding data to an end of the bit string;
referring to a memory that stores multiple codewords used in variable-length encoding and decoded data and code lengths respectively corresponding to the multiple codewords, and outputting decoded data and a code length corresponding to a codeword that matches a codeword at a start of the output bit string;
determining whether or not at least the undecoded bitstream of the first length is accumulated in the buffer;

determining whether or not at least the undecoded bitstream of a second length is accumulated in the buffer, the second length being shorter than the first length; and selecting a determination result from one of the determining regarding the first length and the determining regarding the second length, wherein in the outputting the bit string, when the determination result selected in the selecting indicates that at least the undecoded bitstream of the first length or the second length is accumulated in the buffer, a new starting bit is set based on the output code length and a new bit string of the first length is output in accordance with the set starting bit; and in the selecting, the selection of the determination result is switched based on the length of the undecoded bitstream accumulated in the buffer.

16. An integrated circuit that decodes a bitstream containing variable-length encoded data, said circuit comprising:

a storage configured to store multiple codewords used in variable-length encoding as well as decoded data and code lengths respectively corresponding to the multiple codewords;

a bit outputter that includes a buffer that accumulates the bitstream and that is configured to output a bit string of a first length starting from a starting bit of an undecoded bitstream accumulated in the buffer, and when a length of the undecoded bitstream accumulated in the buffer is less than the first length, output the bit string of the first length by adding data to a end of the bit string;

a referrer configured to output decoded data and a code length corresponding to a codeword that matches a codeword at a start of the bit string output by said bit outputter with reference to said storage;

a first determiner configured to determine whether or not at least the undecoded bitstream of the first length is accumulated in the buffer;

a second determiner configured to determine whether or not at least the undecoded bitstream of a second length is accumulated in the buffer, the second length being shorter than the first length; and a selector configured to select a determination result from one of said first determiner and said second determiner, wherein said bit outputter is configured to, when the determination result selected by said selector indicates that at least the undecoded bitstream of the first length or the second length is accumulated in the buffer, set a new starting bit based on the code length output by said referrer and output a new bit string of the first length in accordance with the set starting bit; and said selector is configured to switch the selection of the determination result between said first determiner and said second determiner based on the length of the undecoded bitstream accumulated in the buffer.

* * * * *